(12) United States Patent
Kumar et al.

(10) Patent No.: US 7,498,242 B2
(45) Date of Patent: Mar. 3, 2009

(54) PLASMA PRE-TREATING SURFACES FOR ATOMIC LAYER DEPOSITION

(75) Inventors: Devendra Kumar, Los Altos Hills, CA (US); Kamal Kishore Goundar, Yokohama (JP); Nathanael R. C. Kemeling, Lightheim (JP); Hideaki Fukuda, Tama (JP); Hessel Sprey, Kessel-Lo (BE); Maarten Stokhof, Leuven (BE)

(73) Assignee: ASM America, Inc., Phoenix, AZ (US)

( * ) Notice: Subject to any disclaimer, the term of this patent is extended or adjusted under 35 U.S.C. 154(b) by 143 days.

(21) Appl. No.: 11/359,884

(22) Filed: Feb. 21, 2006

(65) Prior Publication Data

US 2006/0216932 A1    Sep. 28, 2006

Related U.S. Application Data

(60) Provisional application No. 60/655,610, filed on Feb. 22, 2005.

(51) Int. Cl.
*H01L 21/322* (2006.01)

(52) U.S. Cl. .................. 438/474; 438/687; 438/798; 438/FOR. 117; 438/FOR. 447; 257/762; 257/E21.627; 257/E21.641

(58) Field of Classification Search ................ 438/474, 438/687, 798, FOR. 117, FOR. 448; 257/762, 257/E21.627, E21.641
See application file for complete search history.

(56) References Cited

U.S. PATENT DOCUMENTS

| | | | |
|---|---|---|---|
| 5,382,333 A | 1/1995 | Ando et al. | |
| 5,939,334 A | 8/1999 | Nguyen et al. | |
| 6,033,584 A | 3/2000 | Ngo et al. | |
| 6,124,189 A | 9/2000 | Watanabe et al. | |
| 6,130,123 A | 10/2000 | Liang et al. | |
| 6,153,935 A * | 11/2000 | Edelstein et al. | ............ 257/773 |
| 6,420,279 B1 | 7/2002 | Ono et al. | |
| 6,455,445 B2 | 9/2002 | Matsuki | |
| 6,482,262 B1 | 11/2002 | Elers et al. | |
| 6,482,733 B2 | 11/2002 | Raaijmakers et al. | |
| 6,482,740 B2 | 11/2002 | Soininen et al. | |

(Continued)

FOREIGN PATENT DOCUMENTS

EP    0 469 470 A1    7/1991

(Continued)

OTHER PUBLICATIONS

Co-Pending U.S. Appl. No. 11/336,621 filed Jan. 20, 2006. Title: Atomic Layer Deposition of Thin Films on Germanium.

(Continued)

*Primary Examiner*—Thanh V Pham
(74) *Attorney, Agent, or Firm*—Knobbe Martens Olson & Bear LLP

(57) ABSTRACT

Method and structures are provided for conformal lining of dual damascene structures in integrated circuits. Preferred embodiments are directed to providing conformal lining over openings formed in porous materials. Trenches are formed in, preferably, insulating layers. The layers are then adequately treated with a particular plasma process. Following this plasma treatment a self-limiting, self-saturating atomic layer deposition (ALD) reaction can occur without significantly filling the pores forming improved interconnects.

46 Claims, 23 Drawing Sheets

U.S. PATENT DOCUMENTS

| | | | |
|---|---|---|---|
| 6,511,539 B1 | 1/2003 | Raaijmakers | |
| 6,534,395 B2 | 3/2003 | Werkhoven et al. | |
| 6,599,572 B2 | 7/2003 | Saanila et al. | |
| 6,613,695 B2 | 9/2003 | Pomarede et al. | |
| 6,686,271 B2 | 2/2004 | Raaijmakers et al. | |
| 6,727,169 B1 | 4/2004 | Raaijmakers et al. | |
| 6,753,249 B1 | 6/2004 | Chen et al. | |
| 6,759,325 B2 | 7/2004 | Raaijmakers et al. | |
| 6,794,287 B2 | 9/2004 | Saanila | |
| 6,800,552 B2 | 10/2004 | Elers et al. | |
| 6,852,635 B2 | 2/2005 | Satta et al. | |
| 6,878,628 B2 | 4/2005 | Sophie et al. | |
| 6,933,225 B2 | 8/2005 | Werkhoven et al. | |
| 6,933,246 B2 | 8/2005 | Buchanan et al. | |
| 6,949,456 B2 | 9/2005 | Kumar | |
| 6,955,986 B2 | 10/2005 | Li | |
| 6,958,277 B2 | 10/2005 | Pomarede et al. | |
| 6,986,914 B2 | 1/2006 | Elers et al. | |
| 7,056,835 B2 | 6/2006 | Pomarede et al. | |
| 7,202,166 B2 | 4/2007 | Wilk | |
| 2002/0027286 A1 | 3/2002 | Sundararajan et al. | |
| 2002/0098685 A1 | 7/2002 | Sophie et al. | |
| 2003/0064607 A1 | 4/2003 | Leu et al. | |
| 2003/0082296 A1 | 5/2003 | Elers et al. | |
| 2003/0165615 A1 | 9/2003 | Aaltonen et al. | |
| 2003/0232510 A1 | 12/2003 | Buchanan | |
| 2004/0005753 A1* | 1/2004 | Kostamo et al. | 438/222 |
| 2004/0071878 A1 | 4/2004 | Schuhmacher et al. | |
| 2004/0114398 A1 | 6/2004 | Lipcsei et al. | |
| 2004/0121616 A1 | 6/2004 | Satta et al. | |
| 2004/0175928 A1 | 9/2004 | Abell | |
| 2005/0009325 A1* | 1/2005 | Chung et al. | 438/637 |
| 2005/0048797 A1 | 3/2005 | Fukazawa | |
| 2005/0106893 A1 | 5/2005 | Wilk | |
| 2005/0179135 A1 | 8/2005 | Kumar | |
| 2005/0181555 A1 | 8/2005 | Haukka et al. | |
| 2005/0212139 A1 | 9/2005 | Leinikka et al. | |
| 2006/0078679 A1 | 4/2006 | Elers et al. | |
| 2006/0205230 A1 | 9/2006 | Pomarede et al. | |
| 2006/0292872 A1 | 12/2006 | Haukka et al. | |
| 2007/0111521 A1 | 5/2007 | Wilk | |

FOREIGN PATENT DOCUMENTS

| | | |
|---|---|---|
| EP | 1063687 | 12/2000 |
| JP | 8264530 | 10/1996 |
| WO | WO 93/10652 | 5/1993 |
| WO | WO 96/17107 | 6/1996 |
| WO | WO 00/01006 | 1/2000 |
| WO | WO 00/47404 | 8/2000 |
| WO | WO 00/47796 | 8/2000 |
| WO | WO 00/54320 | 9/2000 |
| WO | WO 01/27347 | 4/2001 |
| WO | WO 01/29280 A1 | 4/2001 |
| WO | WO 01/29893 | 4/2001 |
| WO | WO 01/66832 | 9/2001 |
| WO | WO 01/88972 A1 | 11/2001 |
| WO | WO 0199166 | 12/2001 |
| WO | WO 2004/064147 | 7/2004 |
| WO | WO 2004/114398 A | 12/2004 |

OTHER PUBLICATIONS

Hoyas et al., "Growth and Characterization of Atomic Layer Deposited WCO.7NO.3 on Polymer Films," *Journal of Applied Physics*, vol. 95, No. 1, (Jan. 1, 2004).

Jehn et al. "Gmelin Handbook of Inorganic and Organometallic Chemistry," 8th ed. vol. A5b, 131-154, Springer-Verlag, Berlin (1993).

Kirk-Othmer, "Encyclopedia of Chemical Technology," 4th ed., Vo. 4, 841-878, A Wiley Interscience Publication, John Wiley & Sons, New York (1992).

Klaus et al., "Atomic layer deposition of tungsten using sequential surface chemistry with a sacrificial stripping reaction," *Thin Solid Films* 360, 145-153 (2000).

Koh et al. "Meeting the Cu diffusion barrier challenge using ALD tungsten nitride carbide," *Solid State Technology*, 54-58 (Jun. 2005).

Lai et al., "Precursors for Organometallic Chemical Vapor Deposition of Tungsten Carbide Films," *Chem. Mater*, 7, 2284-2292 (1995).

Nakajima et al. "Chemical Vapor Deposition of Tungsten Carbide, Molybdenum Carbide Nitride, and Molybdenum Nitride Films," *J. Electrochem. Soc.*, vol. 144, No. 6 (Jun. 1997).

Onda et al. "Hydrogen Plasma Cleaning a Novel Process for IC-Packaging," semiconductorfabtech.com (Jan. 2, 2002).

Peters, Laura, "Pursuing the Perfect Low-k Dielectric," *Semiconductor International* 21:10 (1998).

Ryan et al. "Material property characterization and integration issues for mesoporous silica," *Proceedings of the IEEE 1999 International Interconnect Technology Conference* 187-189 (1999).

Schumacher et al., "Integration of ALD WCN Into a Dual Damascene Oxide Module."

"Ullmann's Encyclopedia of Industrial Chemistry," 5th ed., vol. A5, 62-154 (1986).

Utriainen et al., Studies of metallic thin film growth in an atomic layer epitaxy reactor using M(acac)$_2$(M=Ni, Cu, Pt) precursors, *Applied Surface Science*, 157, 151-158 (2000).

Wolf et al. "Process and equipment simulation of copper chemical vapor deposition using Cu(HFAC)VTMS," *Microelectronic Engineering*, 45(1):15-27 (Feb. 1999).

Office Action dated Oct. 9, 2007, received in U.S. Appl. No. 11/106,220, in 11 pages.

Singer, Atomic Layer Deposition Targets Thin Films, Semiconductor International, Sep. 1, 1999, 1 page.

International Search Report and Written Opinion dated Jun. 28, 2006, PCT/US2006/005868.

International Search Report, PCT/US01/06746.

Issue Notification & Patent Grant for U.S. Patent No. 7,419,903, U.S. Appl. No. 11/106,220.

* cited by examiner

PLASMA PRE-TREATING SURFACES FOR ATOMIC LAYER DEPOSITION

RELATED APPLICATIONS

The present application claims priority to U.S. Provisional Application No. 60/655,610, filed on Feb. 22, 2005, incorporated by reference in its entirety.

FIELD OF THE INVENTION

The invention relates generally to the treatment of a surface prior to atomic layer deposition (ALD). More particularly, the invention relates to plasma treating a layer prior to high conformality ALD layers over damascene structures in integrated circuits.

BACKGROUND OF THE INVENTION

When fabricating integrated circuits, layers of insulating, conducting, and semiconducting materials are deposited and patterned to produce desired structures. Interconnect "back end" metallization processes include via formation and metal line or wire formation. Via formation vertically connects conductive layers through an insulating layer. Conventionally, contact vias or openings are formed in the insulating layer, such as, PECVD deposited oxide (k=4) formed from tetraethylorthosilicate (TEOS) precursors and PECVD or high density plasma (HDP) deposited fluorinated oxide (FSG) (k=3.4-3.7). The vias are then filled with conductive material, thereby interconnecting electrical devices and wiring above and below the insulating layers. The layers interconnected by vertical vias typically include horizontal metal lines running across the integrated circuit. Such lines are conventionally formed by depositing a metal layer, such as aluminum, over the insulating layer, masking the metal layer in a desired wiring pattern, and etching away metal between the desired wires or conductive lines.

Damascene processing involves forming trenches in the pattern of the desired lines, filling or overfilling the trenches with a metal or other conductive material, and then CMP polishing the metal and stopping on the insulating layer. Wires are thus left within the trenches, isolated from one another in the desired pattern. Recent copper metallization processes, for example, typically employ damascene processing.

In an extension of damascene processing, a process known as dual damascene involves forming two insulating layers, typically separated by an etch stop material (see FIG. 1, described below), and forming trenches in the upper insulating layer, as described above for damascene processing. Of course, there are also alternative approaches available. In some embodiments, one deposits the insulating dielectric in one step without an etch stop layer (see FIG. 2, described below) and forms the trenches in the single insulating layer by performing a timed etch. After the trenches have been etched, a further mask can be employed to etch contact vias downwardly through the floor of the trenches and the lower insulating layer to expose lower conductive elements where contacts are desired. As will be appreciated by one of skill in the art, there are alternative approaches for making the structures as well. For example, the structure can be made in reverse by the via-first trench last (VFTL) approach with a timed etch for the overlying trenches.

Conductive elements, such as capacitors, contacts, runners and wiring layers, must each be electrically isolated from one another for proper integrated circuit operation. In addition to providing insulating layers around such conductive elements, care must be taken to prevent diffusion and spiking of conductive materials through the insulating layers, which can cause undesired short circuits among devices and lines. Protective barriers are often formed between via or trench walls and metals in a substrate assembly to aid in confining metal within the via or trench walls. Barriers are thus useful for damascene and dual damascene interconnect applications, particularly for fast-diffusing elements such as copper.

Candidate materials for protective barriers should foremost exhibit effective diffusion barrier properties. Additionally, the materials should demonstrate good adhesion with adjacent materials (e.g., oxide via walls, adhesion layers, etch stop layers and/or metallic materials that fill the vias and trenches). For many applications, a barrier layer is positioned in a current flow path and so is conductive. Typically, barriers have been formed of metal nitrides ($MN_x$), such as titanium nitride (TiN), tantalum nitride (TaN), and tungsten nitride (WN), which are dense and adequately conductive for lining contact vias, wiring trenches, and other conductive barrier applications.

These lined vias or trenches are then filled with metal by any of a variety of processes, including chemical vapor deposition (CVD), physical vapor deposition (PVD), and electroplating. For effective conductivity and to avoid poor electromigration during operation, the metal of a contact or wiring layer should fill the via or trench without leaving voids or key holes. Completely filling deep, narrow openings with conductive material is becoming ever more challenging as integrated circuit dimensions are constantly scaled down in pursuit of faster operational processing speeds and lower power consumption.

As illustrated in FIGS. 1 and 2, utilizing a conductive barrier layer and/or other liners makes filling the trenches and vias of dual damascene processing even more difficult. FIG. 1 illustrates a dual damascene process in which an upper insulating layer 10 is formed over a lower insulating layer 12, which is in turn formed over a conductive wiring layer 14, preferably with an intervening dielectric diffusion barrier 15. This dielectric barrier 15 serves to prevent copper or other conductive material of the underlying metal 14 from diffusing into the overlying dielectric layer 12.

A mask is employed to pattern and etch trenches 16 in a desired wiring pattern. In the illustrated embodiment, the trench 16 is etched down to the level of an etch stop layer 19, which is formed between the two insulating layers 10, 12. This etch stop layer 19 is typically patterned and etched, prior to deposition of the upper insulating layer 10, to form a buried hard mask that defines horizontal dimensions of desired contact vias that are to extend from the bottom of the trench 16. Continued etching through the hard mask 19 opens a contact via 20 from the bottom of the trench 16 to the lower conductive wiring layer 14. FIG. 1 also shows an upper etch stop or chemical mechanical polishing (CMP) stop layer 21 over the upper insulating layer 10 to stop a later planarization step, as will be appreciated by the skilled artisan. As noted above, this is merely one method of forming dual damascene trenches and vias. In other embodiments, a VFTL (via-first, trench-last) approach can be used with a timed etch instead of employing an etch stop layer. This scheme is demonstrated in FIG. 2, in which CMP stop and buried hard masks are omitted.

After removing photoresist, residue removal and/or other cleaning steps, protective liners 22, preferably formed of conductive material, are then formed on the exposed horizontal and sidewall surfaces. Typically, the liners 22 at least include a metal nitride, and may additionally include adhesion enhancing and seeding layers. For example, the liner 22 can comprise a tri-layer of Ti/TiN/Cu. In such a structure, the titanium layer serves to improve adhesion with exposed oxide sidewalls; the titanium nitride serves as a diffusion barrier; and a thin copper layer serves as a seed for later electroplating of copper. In other examples, the liners 22 can include tantalum nitride or tungsten nitride barriers. The skilled artisan will appreciate that other barrier materials can also be employed.

Conformal deposition of the liners 22, however, is very difficult with conventional processing. For example, physical vapor deposition (PVD), such as sputtering, of a metal layer (for adhesion, barrier and/or seed layer) requires thickness of at least about 50 Å over all surfaces of the trench 16 and contact via 20. Unfortunately, PVD of metal into high aspect ratio voids necessitates much greater deposition on the top surfaces of the workpiece to produce adequate coverage of the via bottom. For example, some state-of-the-art trench and contact structures for dual damascene schemes require about 150-250 Å PVD metal in order for 50 Å of metal to reach the bottom and sidewalls of the contact via 20. Some schemes have required as much as 500 Å PVD metal in order for 50 Å of metal to reach the bottom and sidewalls of the contact via 20.

This poor step coverage is a result of the high aspect ratio of voids formed for dual damascene processing in today's integrated circuits. The aspect ratio of a contact via is defined as the ratio of depth or height to width. In the case of dual damascene contacts, the trench 16 and contact via 20 together reach through two levels of insulating layers 10, 12, such that the effective aspect ratio of the via 20 is very high.

Conventional deposition processes produce very poor step coverage (i.e., the ratio of sidewall coverage to field or horizontal surface coverage) of such high aspect ratio vias for a variety of reasons. Due to the directionality of PVD techniques, for example, deposition tends to accumulate more rapidly at upper corners 26 of the trench 16 and upper corners 28 of the via 20, as compared to the via bottom 30. As a result of the rapid build-up of deposited material on the upper surfaces of the structure, the lining layers occupy much of the conductive line width in the trench 16 and even more, proportionately, of the contact via 20. These built-up corners 26, 28 then cast a shadow into the lower reaches of the structure, such that lower surfaces, and particularly lower corners, are sheltered from further deposition. Although PVD deposition can be directed more specifically to the via bottom, e.g., by collimation or by ionization of the depositing vapor, such additional directionality tends to sacrifice sidewall coverage.

Chemical vapor deposition (CVD) processes have been developed for certain metals and metal nitrides. CVD tends to exhibit better step coverage than PVD processes. In order for CVD processes to exhibit good step coverage, the reaction must be operated in the so-called "surface controlled" regime. In this regime, reaction species do not adhere to trench or via walls upon initial impingement. Rather, the species bounce off trench/via surfaces several times (e.g., 10-500 times) before reacting.

State-of-the-art CVD processes for depositing barrier layers at temperatures sufficiently low to be compatible with surrounding materials do not operate completely within the surface-controlled regime. Accordingly, even CVD processes tend to deposit far less material at the bottom of a dual damascene contact via 20 then on the upper surfaces and sidewalls of the structure. The upper corners of the trench 16 and the contact via 20 represent a high concentration of surface area to volume. Deposition upon the horizontal upper surfaces and adjacent vertical sidewall surfaces merge together to result in an increased deposition rate near the corners 26, 28. Additionally, flowing reactants diffuse slowly into the confined spaces of the trench 16 and contact via 20. Accordingly, the concentration of reactants reaching the via bottom 30 is far reduced relative to the concentration of reactants reaching upper surfaces of the structure. Thus, while somewhat improved relative to PVD, CVD step coverage of dual damascene structures remains uneven with most currently known low temperature CVD techniques.

In the pursuit of devices with faster operational speeds and lower power consumption, dimensions within integrated circuits are constantly being scaled down. With continued scaling, the aspect ratio of contacts and trenches continues to increase. This is due to the fact that, while the width or horizontal dimensions of structures in integrated circuits continues to shrink, the thickness of insulating layers separating metal layers cannot be commensurately reduced. Reduction of the thickness in the insulating layers is limited by the phenomenon of parasitic capacitance, whereby charged carriers are slowed down or tied up by capacitance across dielectric layers sandwiched by conductive wires. As is known, such parasitic capacitance would become disabling if the insulating layer were made proportionately thinner as horizontal dimensions are scaled down.

With reference to FIG. 2, a scaled-down version of FIG. 1 is depicted, wherein like parts are referenced by like numerals with the addition of the suffix "a." FIG. 2 also differs from FIG. 1 in illustrating a dual damascene scheme without a buried hard mask on etch stop layer and without an upper CMP stop. As shown, continued scaling leads to a more pronounced effect of uneven step coverage while lining dual damascene structures. Material build-up at the corners 28a of the contact via 20a quickly reduces the size of the opening, even further reducing the concentration of reactants that reach into the contact via 20a. Accordingly, coverage of the via bottom surface 30a drops off even faster. Moreover, the percentage of the trench 16a occupied by the liner (e.g., barrier) materials is much greater for the scaled down structure of FIG. 2. Since the lining material is typically less conductive than the subsequent filler metal (e.g., copper), overall conductivity is reduced. Worse yet, cusps at the corners 28a of the contact via can pinch off before the bottom 30a is sufficiently covered, or during deposition of the filler metal.

Independently of efforts to improve barrier film uniformity are efforts to reduce the dielectric or permittivity constant (k) value of the interlevel dielectric (ILD) material. A reduced dielectric constant value results in less parasitic capacitance per unit thickness of the ILD, such that for a given circuit design tolerance for parasitic capacitance, a so-called "low k" material can provide a thinner ILD. "Low k" designates a material with a k value below that of silicon oxide (k≈4) and fluorinated silicate glass (FSG) (k≈3.4-3.7), the currently predominant ILD material in integrated circuit fabrication. Accordingly, the aspect ratio of contacts and trenches to be filled can be reduced and lining these openings becomes easier.

A variety of materials and techniques are being developed for producing low k films in integrated circuits. Deposition methods currently include spin-on deposition, CVD, plasma enhanced CVD (PECVD) and high density plasma (HDP) CVD, depending upon the characteristics desired. Some of the methods and films have been described by Laura Peters, "Pursuing the Perfect Low-k Dielectric" *Semiconductor International*, Vol. 21, No. 10 (September 1998), and the references cited therein. Some films have a k value from 3 to 3.5 such as hydrogen silsesquioxane (HSQ) and fluorinated oxides (FSG). Organic polymers, such as benzoncyclobutene (BCB) and polyarylene ethers (PAE), exhibit even lower k values between 2.5 and 3 range. Other work with polytetrafluoroethylene (PTFE) using spin-on techniques has achieved intrinsic k values of about 1.9. ASM Japan K.K. has developed low k materials formed by plasma enhanced CVD, including low-k, ultra low-k (ULK, which can be porous or non-porous) and extreme low-k (ELK, which is generally porous) materials. Other companies have created nanoporous inorganic-organic hybrids.

Use of such low k materials as an ILD in an integrated circuit will considerably reduce the aspect ratios of openings in the ILD because one can make the openings thinner for a given tolerable parasite capacitance. Accordingly, lining such openings with adequate conformality should prove simpler as compared with lining openings with higher aspect ratios.

Integrating these new materials with existing technologies, however, introduces its own challenges. Among other requirements, low k films exhibit sufficiently high chemical, thermal and mechanical stability in the face of disparate adjacent materials and exposure to a variety of processing environments. ILD materials should be compatible with etching, deposition, cleaning and polishing processes in order to integrate reliably with a manufacturing process. As will be appreciated by the skilled artisan, integration of new materials and processes into established process flows is rarely a straightforward matter, as evidenced by complications arising from the introduction of copper lines into state-of-the-art integrated circuit designs.

It would accordingly be advantageous to provide low k material without changing the material characteristics of the ILD with each succeeding generation. One manner in which the k value of a material can be lowered without changing the material properties of the ILD is to make the material porous. In effect, porous dielectrics combine the dielectric strength of air ($k \approx 1.0$) with that of the dielectric material in which the pores are formed. Advantageously, the k value of a porous material is "tunable" in the sense that the k value can be altered without introducing new materials by changing the porosity of a material that has already been integrated.

Currently silicon oxide ($k \approx 4$) is widely used in process flows. Porous versions of silicon oxide or "silica" can have both a low k value and compatibility with current process flows. This has led to the development of classes of porous silica known as nanogels, aerogels, xerogels and mesogels. Similarly, newer low k materials, once integrated into process flows, can have their k values tuned by adjusting porosity of the low k material. With low k materials currently under development, it appears that achieving k values below 2.5 will likely involve providing a porous insulating material.

Lining such materials, in an effective manner, is not a simple process. Although CVD and PVD may adequately line a low aspect ratio opening, non-conformality of conventional deposition techniques can still be problematic. Also, as the interconnect dimensions are shrinking, the percentage of copper with respect to barrier in the vias is not shrinking, thereby increasing via resistance. Atomic layer deposition (ALD) can be helpful in overcoming some of the problems presented by CVD and PVD processes (see, U.S. Pat. No. 6,482,733, issued Nov. 19, 2002, and U.S. Pat. No: 6,759,325, issued Jul. 6, 2004 herein incorporated by reference in their entireties). However, some embodiments disclosed previously can still have difficulties with adhesion, shorting, and general failure. Moreover, many of these previous approaches employed adding additional layers to the insulating layer, which will reduce the volume of copper that can later be introduced into the vias and trenches.

SUMMARY OF THE INVENTION

Methods are provided for the plasma treatment of an insulator to improve the interface of the insulator with a subsequently deposited barrier layer. The barrier layer is deposited by atomic layer deposition (ALD). In a preferred embodiment, the methods provided herein are for depositing lining materials, and particularly barrier materials, into the high-aspect ratio trenches and contact vias of dual damascene metallization schemes. Advantageously, the methods attain high step coverage, such that only the minimum required thickness of the lining layer need be formed on all surfaces. Examples are provided for applying the methods to formation of one or more barrier and seed layers.

In some embodiments, the methods comprise a plasma treatment prior to atomic layer deposition (ALD). In some embodiments, the methods are applied to metallization structures formed in "low k" materials. Prior to a highly conformal self-saturating processes, an exposed low k surface is treated with a particular type of plasma; this manipulates the low k surface. Advantageously, the plasma treated surface or layer can be formed on an insulating material within high-aspect ratio openings (e.g., trenches and vias). As the plasma treating process does not actually deposit a layer onto the low-k dielectric or ultra low-k porous insulating material, later conformal processes can be even more conformal than when a sealing layer is used to seal the porous surfaces. Thus, the remaining volume within these trenches or vias is maximized, facilitating a greater proportionate volume of more highly conductive filler materials, such as copper for metal runners and integral contacts. Additionally, this treatment process can allow one to omit other optional layers, such as adhesion layers.

One aspect of the invention is a metallization process. The process comprises forming trenches in a desired interconnect pattern in a low k insulating layer above a semiconductor substrate, treating an exposed surface of the trenches with a plasma process under conditions sufficient to improve a barrier property of a subsequently deposited barrier layer compared to a barrier layer associated with a surface of trenches that has not undergone the plasma process, and lining the surfaces of the trenches with the barrier layer by an atomic layer deposition (ALD) process.

Another aspect of the invention is an integrated circuit. The integrated circuit comprises a trench in a desired wiring pattern in an insulating layer above a semiconductor substrate. The integrated circuit further comprises a contact via extending downwardly from a floor of the trench to expose at least part of an underlying conductive element. The integrated circuit further comprises a barrier layer directly on a surface of the trench and a copper layer attached to the barrier layer. The barrier layer can comprise tungsten, nitrogen and carbon.

Another aspect of the invention is a cluster tool configured for metallization. The tool comprises a first chamber that is configured for in situ plasma treatment of an insulating surface on a substrate. The tool further comprises a second chamber that is configured for an atomic layer deposition of a metal nitride carbide barrier material. The tool further comprises a third chamber that is configured for applying a seed layer to the metal nitride carbide material. The tool further comprises a volume between the first, second, and third chambers. The volume between the chambers allows the substrate to travel between the first, second, and third chambers within the volume. The volume between the first, second, and third chambers is configured to maintain vacuum during transfer among the chambers.

Another aspect of the invention is a method of making an integrated circuit. The method comprises plasma processing a surface of an insulating layer. The plasma processing comprises the use of a reducing plasma to process the surface. After plasma processing the surface of the layer, the method further comprises lining the surface with a barrier layer deposited via atomic layer deposition (ALD). The barrier layer comprises metal, carbon, and nitrogen. The resulting interface between the surface and the barrier layer is relatively uniform in that the standard deviation of thickness of the barrier layer is less than about 5% of the mean of the thickness of the barrier.

Another aspect of the invention is a metallization process. The process comprises forming trenches and vias in a desired interconnect pattern in a low k insulating layer above a semiconductor substrate, and treating an exposed surface of the trench with a plasma process. The plasma process comprises a $H_2$/He plasma and can treat substantially all of the exposed surfaces of the trenches. After treating an exposed surface of the trench with the plasma process, the metallization process further comprises lining the surfaces of the trench with the liner layer by an atomic layer deposition (ALD) process.

Another aspect of the invention is a damascene metallization process. In some embodiments, the process comprises forming a trench in a desired wiring pattern in a low k, ultra-low k (ULK), extreme-low k (ELK) porous insulating layer above a semiconductor substrate, forming a contact via extending downwardly from a floor of the trench to expose at least part of an underlying conductive element, and treating an exposed surface of the trench with a He/$H_2$ plasma process under conditions sufficient to improve a barrier property of a barrier layer compared to a barrier layer associated with a surface of a trench that has not undergone a He/$H_2$ plasma process. After treating an exposed surface of the trench with the He/$H_2$ plasma process, one lines the surfaces of the trench with the barrier layer by an atomic layer deposition (ALD) process, and deposits a copper seed layer.

Another aspect of the invention is a damascene metallization process that comprises forming a damascene trench in a desired wiring pattern in a low k insulating layer above a semiconductor substrate, treating an exposed surface of the trench with a He/$H_2$ plasma process under conditions sufficient to improve a barrier property of a barrier layer compared to a barrier layer associated with a surface of a trench that has not undergone a He/$H_2$ plasma process, and lining the surfaces of the trench with a barrier by an atomic layer deposition (ALD) process. The ALD process comprises applying a carbon phase, applying a tungsten phase and applying a nitrogen phase.

Another aspect of the invention is a method of making an integrated circuit. The method comprises forming a trench in a porous insulating layer above a semiconductor substrate, forming a contact via extending downwardly from a floor of the trench to expose at least part of an underlying conductive element, $H_2$ plasma processing the trench and via, wherein between the formation of the trench and via and the $H_2$ plasma processing, the trench and via are not subject to oxidation, after treating an exposed surface of the trench with the $H_2$ plasma process, lining the surfaces of the trench with a barrier layer, and forming an electrochemical deposition seed layer over the barrier layer.

Another aspect of the invention is an integrated circuit that comprises a trench in a desired wiring pattern in an insulating layer above a semiconductor substrate, a contact via extending downwardly from a floor of the trench to expose at least part of an underlying conductive element, a barrier layer directly on a surface of the trench, wherein the barrier layer comprises tungsten, nitrogen and carbon, and a copper layer attached to the barrier layer.

Another aspect of the invention is an integrated circuit that comprises a trench in a desired wiring pattern in an insulating layer above a semiconductor substrate, a contact via extending downwardly from a floor of the trench to expose at least part of an underlying conductive element, an insulating surface that is effectively configured the same as a $H_2$/He plasma treated insulating surface, a barrier layer directly on the $H_2$ plasma processed surface of the trench, wherein the barrier layer comprises tungsten, nitrogen and carbon, and a copper layer attached to the barrier layer.

Another aspect of the invention is an integrated circuit that comprises a trench in a desired wiring pattern in a low k insulating layer above a semiconductor substrate and a barrier layer directly on a surface of the trench, wherein the barrier layer comprises tungsten, nitride, and carbide.

Another aspect of the invention comprises a damascene metallization process. The process comprises forming a trench in a porous insulating layer above a semiconductor substrate, forming a contact via extending downwardly from a floor of the trench to expose at least part of an underlying conductive element, treating the exposed part of the underlying conductive element with an oxide removal process to reduce any oxidized metal, treating the surface of the trench and via after the oxide removal process with an He/$H_2$ plasma to improve a barrier property of a barrier layer associated with the trench and via, wherein the barrier property is improved relative to a barrier layer in a similar trench that has not undergone effective He/$H_2$ plasma processing, lining the surfaces of the trench with the barrier layer, and reacting a reactant species with the barrier layer.

Another aspect of the invention is a lined damascene trench. The lined trench comprises a trench in a porous insulating layer above a semiconductor substrate, the porous insulating layer comprises an —$SiR_2O$— repeating structural unit, a contact via extending downwardly from a floor of the trench to at least part of an underlying conductive element, and a barrier layer on a surface of the trench and a surface of the via, wherein the barrier layer has greater than about 90% step coverage, wherein an interface between the surfaces and the barrier layer is relatively uniform, and wherein relatively uniform is that the standard deviation of thickness of the barrier layer is less than about 1% of the mean of the thickness of the barrier.

In some embodiments of the invention, the plasma treatment of the insulating material occurs prior to the deposition of a barrier layer and the barrier layer is deposited by atomic layer deposition (ALD).

Another aspect of the invention is a device for performing any of the methods described above. The device comprises a first chamber that is configured for in situ plasma treatment of an insulating surface, a second chamber that is configured for an atomic layer deposition process, and a third chamber that is configured for applying a copper layer to an ALD treated surface.

BRIEF DESCRIPTION OF THE DRAWINGS

These and other aspects of the invention will be readily apparent to the skilled artisan in view of the description below, the appended claims, and from the drawings, which are intended to illustrate and not to limit the invention, and wherein:

FIGS. 5-9 and 17A-17E are schematic cross-sections of a partially fabricated integrated circuit, generally illustrating the construction, lining and filling of a trench and via formed in insulating layers above a semiconductor substrate, in accordance with a dual damascene process flow.

FIG. 5 shows a first or lower insulating layer 50 over a barrier layer 51 and a conductive element 52 which forms part of a lower interconnect layer.

FIG. 6 shows the structure of FIG. 5 after an optional etch stop layer or hard mask 54 is formed over the insulating layer 50.

FIG. 7 shows the structure of FIG. 6 after a mask and etch process has transferred a pattern of openings 55 to the optional etch stop 54.

FIG. 8 shows the structure of FIG. 7 after a second or upper insulating layer 56 has been formed over the optional etch stop layer 54 and a second optional etch or CMP stop layer 58 have been formed over the upper insulating layer 56.

FIG. 9B shows a non-capped dual damascene structure with a higher effective aspect ratio resulting from mask misalignment.

FIG. 9C shows a contact via 62 that is not fully landed, with a small but very high aspect ratio overetch hole 72.

FIG. 9D shows cavities 80 resulting from a selective etch from the via bottom.

FIG. 9E depicts a damascene structure with a barrel-shaped profile in the trench 60 and via 61 resulting from attack on the insulating layers 50, 56 during removal of photoresist.

FIG. 17A shows a plasma treated insulating layer of FIG. 9A. The optional etch stop layer 58 is not present in this integration scheme.

FIG. 17B shows a barrier layer 150 deposited on the plasma treated surfaces 148 of the insulator 56 and 50 of FIG. 17A.

FIG. 17C shows the dual damascene structure of FIG. 17B after additional lining with a seed layer 155.

FIG. 17D shows the dual damascene structure of FIG. 17C over filled with a highly conductive metal 160.

FIG. 17E shows the filled damascene structure of FIG. 17D with isolated lines 170 formed by planarization by chemical mechanical polishing (CMP) or other etch back process.

Figure 1:
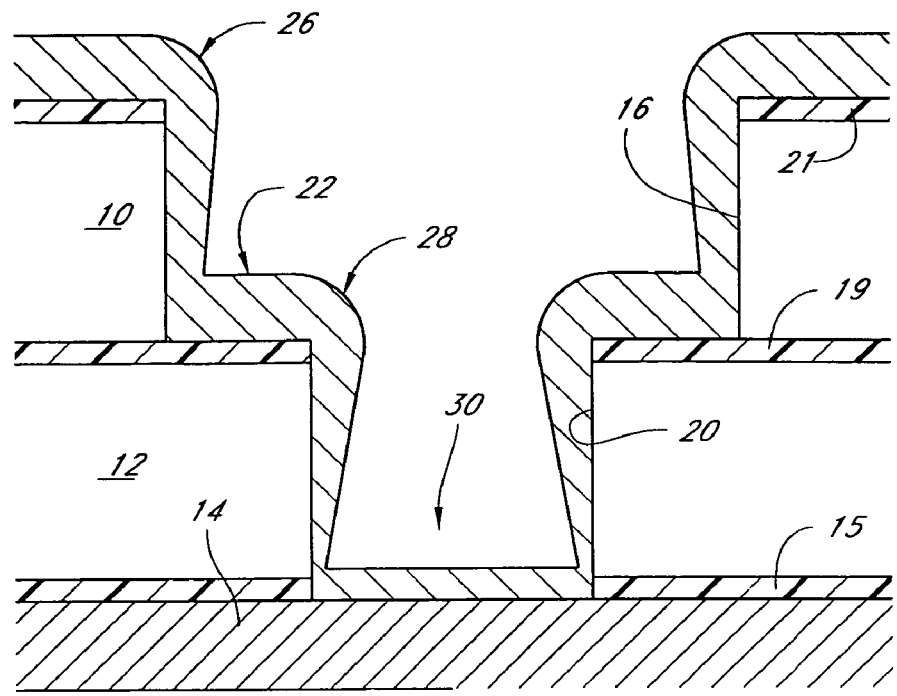
FIG. 1 is a schematic cross-section of a dual damascene structure having a conventional barrier layer lining the trench and contact via thereof.
Figure 2:
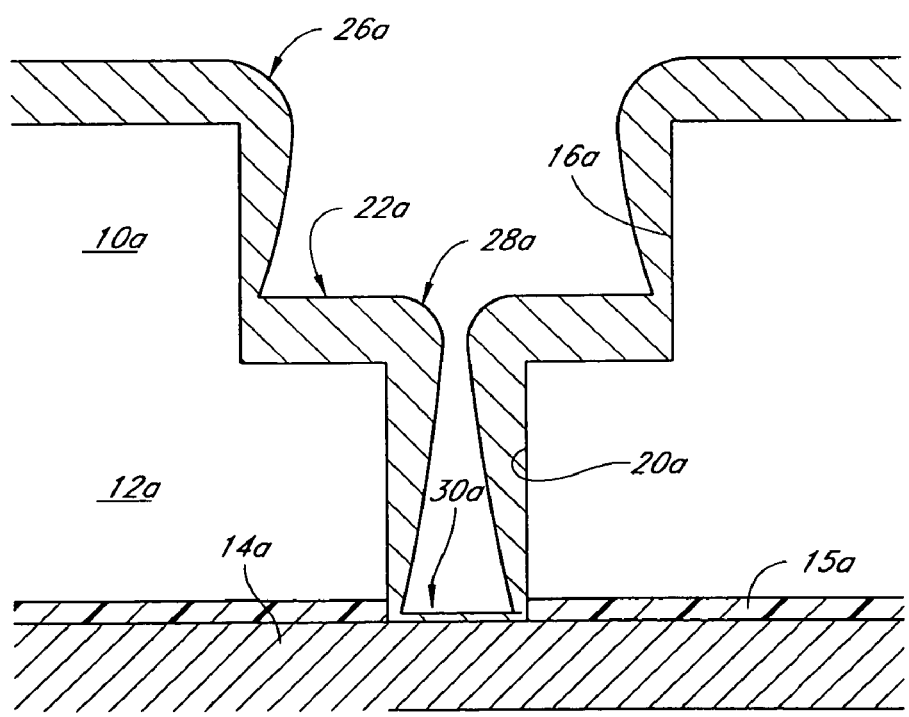
FIG. 2 generally illustrates a lined dual damascene structure, similar to FIG. 1, for a scaled-down integrated circuit.

The above figures are representative embodiments of various aspects of the inventions. Other embodiments are also disclosed herein and need not contain any or all of the elements described in the figures.

DETAILED DESCRIPTION OF THE PREFERRED EMBODIMENT

Though described in the context of certain preferred materials, it will be understood, in view of the disclosure herein, that the methods and structures described will have application to a variety of other materials for lining damascene structures.

As discussed in the Background section above, lining damascene structures, and particularly dual damascene structures, by physical vapor deposition (PVD), conventional chemical vapor deposition (CVD), and even atomic layer deposition (ALD) disadvantageously fills a volume of the trenches and contact vias. Accordingly, less room is left for the highly conductive filler material to follow. Use of a thinner liner, or preferably no material, would leave more room for highly conductive filler metals such as copper which would, in turn, increase conductivity and operational signal transmission speeds for the integrated circuit. Additionally, conventional methods such as PVD and CVD, by their very nature, produce thicker layers in the damascene structure. While much research has been devoted to obtaining more conformal step coverage of dual damascene trenches and contact vias, it is difficult to supply the same concentration of reactant species (or PVD sputtered material) to all surfaces of such structures. In particular, it is difficult to supply the same concentration of depositing species at the upper surfaces of such structures as supplied to the bottom of deep, confined contact vias that extend from the bottom of an already-deep trench.

Instead of approaching the problem by adding an additional layer, the Inventors have discovered that many, if not all, of the issues can be addressed through particular forms of plasma processing or "plasma interface engineering" of the surface of the insulating layer. As the process is plasma based, it can allow for complete coverage of all exposed surfaces of the insulating layers. Additionally, as the process is plasma based, it does not add an additional layer that would reduce the available space in the trench or via for the copper. Additionally, some embodiments can be performed on tools available in the manufacturing fabrication facilities as a cost-effective process. Moreover, this plasma based process can be used in making integrated circuits and results in circuits with improved barrier properties, e.g., increase lifetimes, lower resistance, superior uniformity, and more precise interfaces. In addition, devices which carry out the desired method are also contemplated and can share the above advantages.

Plasma Processing

Plasma processing of a layer is done under conditions sufficient to achieve any of the desired benefits identified herein. In some embodiments, the plasma process is performed on a surface of a low k insulator to create a plasma treated surface from the surface of the insulating material; however, the material need not be limited to an insulating material. In preferred embodiments, the material is a porous material, as it is believed that the plasma processing has additional advantages with such material. However, it is believed that plasma treating any surface (e.g., high or low k, ultra-low k (ULK), extreme-low k (ELK), porous or not, insulator or not), under optimized conditions, can result in at least some of the superior aspects described herein. The "plasma treated layer," while created from the surface of the insulating material, is distinct from the rest of the untreated insulating material as it demonstrates the improved properties identified herein. This plasma treated layer can then be covered by a barrier layer, which can be deposited by an atomic layer deposition (ALD) process.

As will be appreciated by one of skill in the art, the plasma itself can comprise various substances. The conditions under which the insulating layer is subjected to the plasma can also play an important role in determining the effectiveness of the treatment or processing. As will be clear from the examples below, not every plasma treatment will work as well as others. Indeed, some plasmas actually may decrease the desired properties of a circuit. However, given the present disclosure, one of skill in the art can readily determine which plasmas and conditions are capable of generating the desired results.

While the actual conditions for generating the plasma can vary and will depend upon the desired properties of the product, the following section outlines relevant variables and prime ranges for those variables. In one embodiment, the plasma comprises $H_2$ or He, more preferably the plasma comprises a combination of $H_2$ and He. In some embodiments, 50-300 sccm of He and 1-100 sccm of $H_2$ are used to support the plasma, more preferably 100-200 sccm of He and 10-50 sccm of $H_2$, and most preferably about 180 sccm of He and about 20 sccm of $H_2$, are used. In some embodiments the ratio of $H_2$ to He is relevant for adjusting for a desired outcome. For example, a ratio of $H_2$ to He can vary between A) 1 part $H_2$ to 19 parts He and B) 160 parts $H_2$ to 40 parts He by volume. In a preferred embodiment, 1 part $H_2$ to 9 parts He, by volume, is used. In some embodiments, some amount of He is required to be with the $H_2$ for the formation of an effective plasma. It has been discovered that the combination of He and $H_2$ results in a particularly effective plasma for the formation of the plasma treated surface, which possesses superior properties over other surfaces treated with other plasmas.

In alternative embodiments, $NH_3$ can be used for the plasma, preferably at a power of less than 1000 W. Alternatively, various combinations of $N_2$ and $H_2$ can be used in the creation of the plasma. The amount of nitrogen to hydrogen can be adjusted by one of skill in the art and the ratios can be guided by the same principles as those which resulted in the above described ratios of $H_2$ to He. In some embodiments, the conditions are systematically adjusted until at least one of the results described below for the $H_2$/He plasma treated layers is achieved. Alternatively, inert gases can be used for the creation of the plasma. Alternatively, any reducing plasma can be used for the creation of the plasma. The conditions can be optimized by the techniques and to the results described herein.

In some embodiments, when a non-$H_2$/He plasma is used, the insulating layer to be treated is a low k material, preferably with a k value of less than 3.4. Additionally, when such plasmas are used, the treatment is preferably followed by an ALD step. In some embodiments, this is done without exposing the surface to an oxidative atmosphere.

In some embodiments, the plasma pretreatment step is performed for a sufficient duration so as to change the structure of the layer that is exposed to the plasma pretreatment.

In some embodiments, it is preferable that the plasma treatment alters a surface to improve interface properties with subsequently deposited layers on the plasma treated surface, particularly ALD-formed layers.

In some embodiments, the plasma is created in situ by using an electrode gap of 1-15 mm between the electrodes, preferably the gap is 4-10 mm, and most preferably the gap is 3-5 mm. In an alternative embodiment, the plasma is generated remotely. The plasma is preferably an isotropic or unbiased plasma. This allows for treatment of the entire or substantially all of the surfaces of the trench and vias. In particular, the form of plasma treatment can allow for the treatment of the side, or vertical sections of the trenches and/or vias, in addition to the bottom of the vias, to be plasma processed. In a preferred embodiment, the plasma is not biased or directional.

In some embodiments, the plasma is a reducing plasma and can 1) plasma treat the surface as described to obtain a plasma processed surface, and 2) remove any metal oxide (e.g., Cu oxide) from the via bottom. In some embodiments, both events occur, resulting in superior surface interfaces for the barrier with both the insulator and conductor at the via bottom. The plasma is preferably an isotropic plasma and can be generated in a remote plasma chamber. Unlike the use of biased or directional etches to remove an oxide from a via (e.g., by a directional sputter etch), the isotropic plasma allows the sides of the trench to be processed as well. As will be appreciated by one of skill in the art, in embodiments in which both events occur, the plasma will also be reducing in nature (e.g., including H* excited species) in order to remove the oxide. The removal of the oxide can be beneficial in allowing sufficient conductivity between metal layers.

In some embodiments the plasma is created by using a frequency of 10 MHz to 27 MHz, at 1000-2000 W, more preferably the frequency is 10-20 MHz, at 1250-1750 W, and most preferably the frequency is about 13.5 MHz, at about 1500 W. In some embodiments the temperature of the substrate is 200-400° C., more preferably 250-350° C., and most preferably about 300° C.

The above ranges are provided for initial guidance as to the relevant ranges of these variables. As will be appreciated by one of skill in the art, in light of the present teaching, the above variables can be adjusted so that a desired characteristic of an interface between an insulating layer and the barrier layer, or a characteristic of the barrier layer itself, can be achieved.

In general, the plasma process alters the concentration or distribution of particular atoms, bonds, or charge on the insulating surface. Without being limited by theory, the Inventors hypothesize that this treatment can physically alter the insulating layer to prevent later administered layers from entering the pores or voids of the insulating layer. Thus, the plasma treatment process can comprise a reforming process to collapse or otherwise seal the pore openings at such upper surfaces. It may be that the plasma process breaks the bonds at the surface of insulating material and thus allows following ALD processes to nucleate more easily. Regardless of the actual mechanism of action, the plasma treated insulating surface is a different surface from the untreated insulating surface. A surface with such a structure can be referred to as a "plasma treated layer" or "plasma treated surface."

Figure 3:
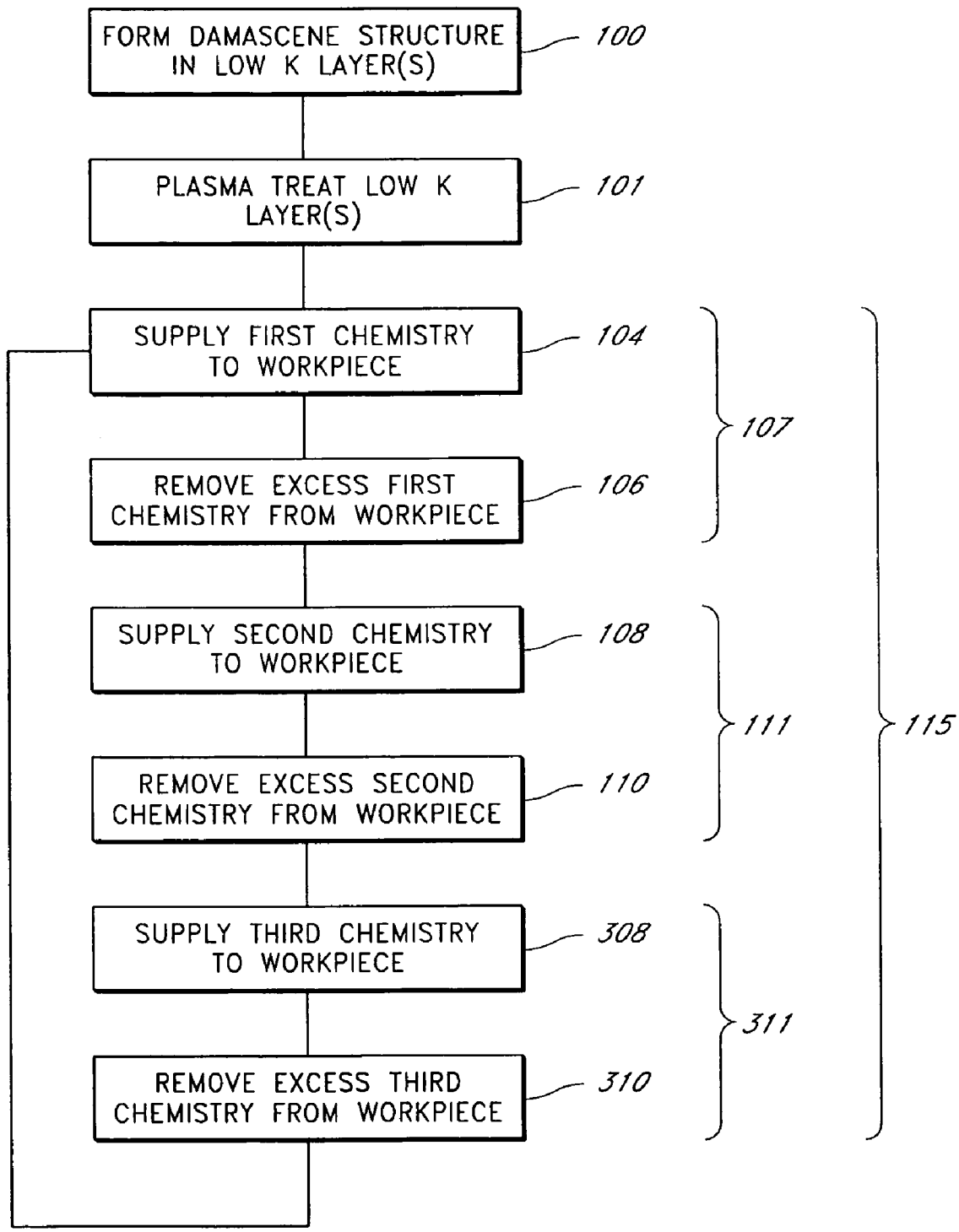
FIG. 3 is a flow chart generally illustrating a method of lining high aspect ratio, dual damascene structures prior to filling with a more highly conductive material.

In a preferred embodiment for making such an integrated circuit, the plasma process is a He/$H_2$ plasma process that is performed on a low k, ULK, or ELK insulating layer comprising —SiR$_2$O—. After the plasma processing, a tungsten nitride carbide barrier layer is then deposited directly on the plasma treated surface of the low k insulating material and then copper is used to fill the trench and vias. The following section generally describes the basic process for making such a plasma treated circuit. FIG. 3 generally illustrates a method of forming the plasma treated integrated circuits. The preferred method includes a plasma treatment of the insulating layer and at least one process step that is a form of atomic layer deposition (ALD), whereby reactants are supplied to the workpiece in alternating pulses in a cycle.

Circuit Construction

Insulating Layers

With reference to FIGS. 5-8, insulating layers are formed over a semiconductor substrate. As will be appreciated by one of skill in the art, there are a variety of methods by which such insulating layers can be formed and processed. Unless otherwise indicated, this will not limit the scope of the invention and any method or technique of insulator formation and processing can be used.

Figure 5:
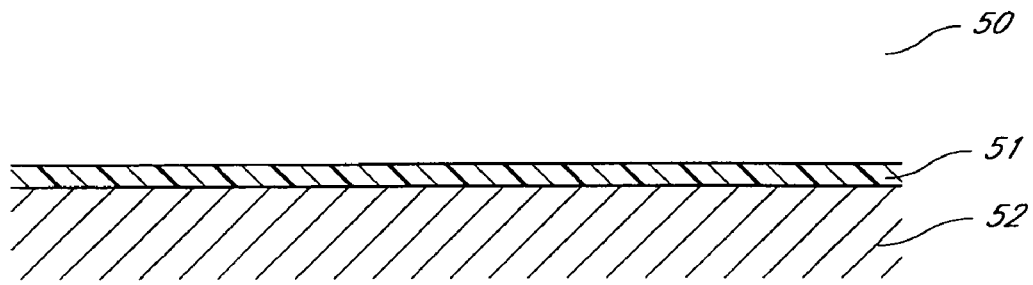
Figure 6:
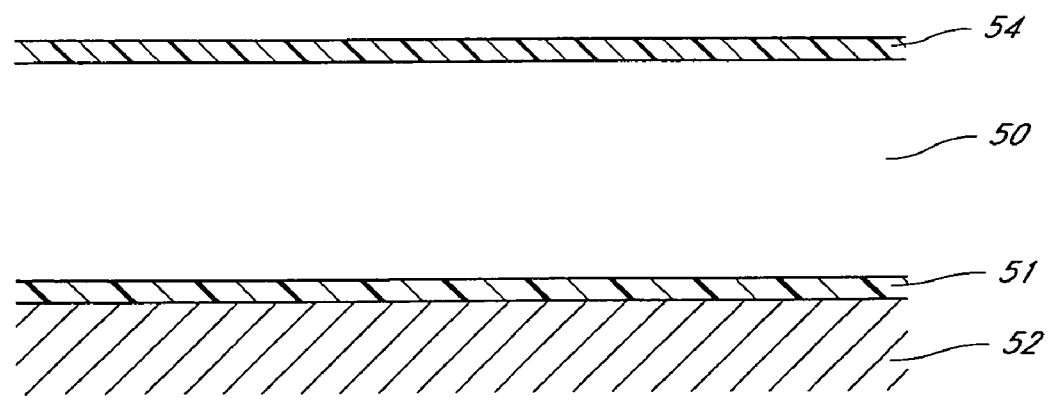
Figure 7:
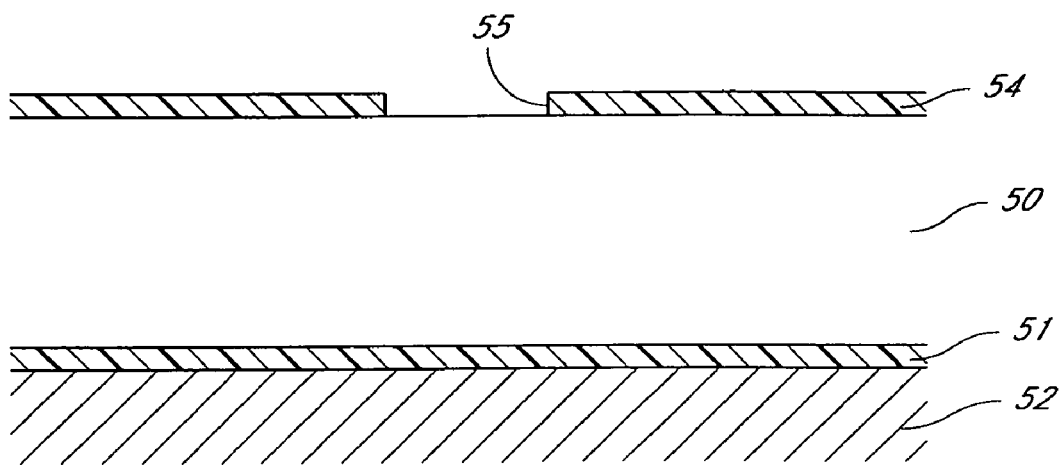
Figure 8:
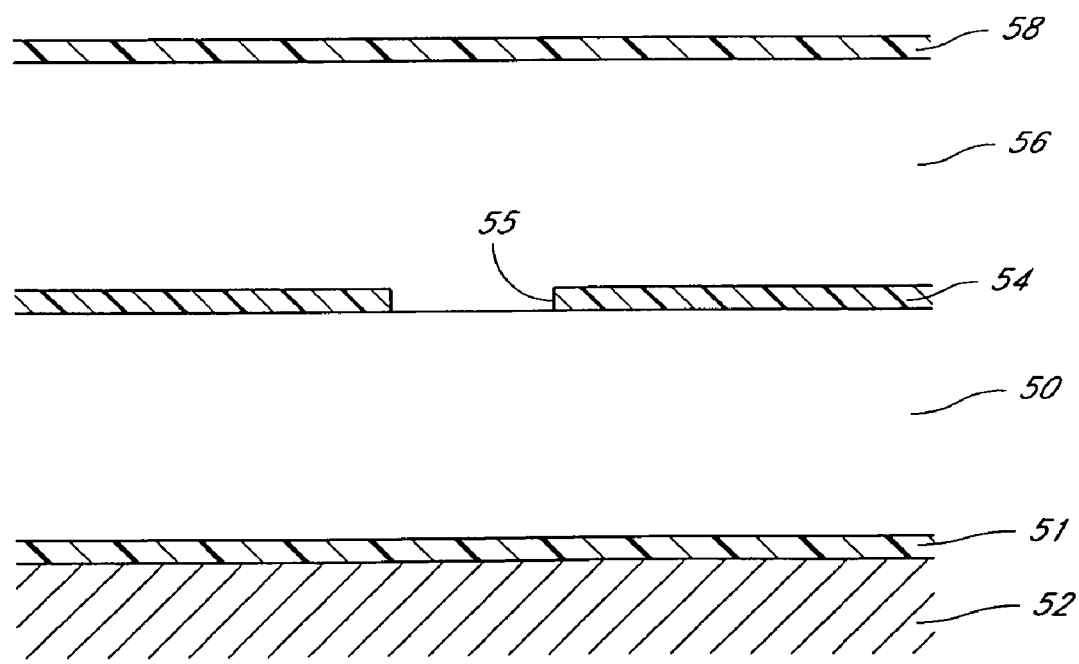

One embodiment of making the layer is shown in FIGS. 5-8. Referring initially to FIG. 5, a first or lower insulating layer 50 is formed over a barrier layer 51 and a conductive element 52, which forms part of a lower interconnect layer in the illustrated embodiment. As will be appreciated by the skilled artisan, metallization schemes typically employ one metal composition throughout various wiring layers (e.g., copper interconnects or aluminum interconnects). The preferred embodiments are adaptable to many different materials, but certain embodiments are particularly adapted to lining damascene structures wherein the via floor or lower conductive element 52 comprises a highly conductive copper line. The first insulating layer 50 is preferably formed to a thickness sufficient to insulate the lower conductive element 52 from upper wiring structures to be formed. An etch stop layer or hard mask 54 (FIGS. 6-7) is formed over the lower insulating layer 50 and a second or upper insulating layer 56 (FIG. 8) is formed over the etch stop layer 54. A second etch or CMP stop layer 58 (also known as a shield layer) is preferably also formed over the upper insulating layer 56. In other embodiments, the insulating layer is formed without etch stop and/or CMP hard mask layers.

In the illustrated embodiment, each of the lower and upper insulating layers 50, 56 comprise dielectric materials with a thickness less than about 1.0 μm, more preferably less than about 0.8 μm, and most preferably less than about 0.6 μm. The skilled artisan will readily appreciate that the insulating layer can comprise any of a number of suitable dielectric materials. For example, dielectric materials have recently been developed that exhibit low permittivity (low k), as compared to conventional oxides. These low k dielectric materials include polymeric materials, porous materials and fluorine-doped oxides. Additional dielectric materials include ultra-low k (ULK, dielectric of 2.4-2.7) and extreme low k (ELK, k<2.4), described in U.S. Pat. No. 6,949,456 and U.S. Pat. Pub. Nos. 2005/0179135 and 2005/0048797, the entireties of all of which are incorporated by reference. The present methods of lining trenches and contact vias have particular utility in conjunction with such low k materials.

One preferred material is the product of the AURORA® process, commercially available from ASM Japan K.K. of Tokyo, Japan. A description of the AURORA® process is given in U.S. Pat. No. 6,455,445, issued Sep. 24, 2002 to Matsuki and assigned to ASM Japan K.K., the disclosure of which is expressly incorporated herein by reference. As discussed therein, a siloxane polymer insulation film has a dielectric constant of 3.3 or lower and has —SiR$_2$O— repeating structural units. The material has been found to have an anisotropic pore structure that is particularly vertically aligned. Thus, there are more openings at top surfaces than sidewalls The siloxane polymer is formed by directly vaporizing a silicon-containing hydrocarbon compound expressed by the general formula Si$_\alpha$O$_\beta$C$_x$H$_y$ (where α, β, x, and y are integers) and then introducing the vaporized compound to the reaction chamber of a plasma CVD apparatus. The residence time of the source gas is lengthened by reducing the total flow of the reaction gas, in such a way as to form a siloxane polymer film having a microporous structure and a low k-value.

The illustrated insulating layers 50, 56 thus comprise low k materials, and more particularly porous low k materials, exhibiting a dielectric constant (k) less than about 3.3. Preferably, the k value of the insulating layers is less than about 3.0, more preferably less than about 2.5, and most preferably less than about 2.0.

As set forth in the Background section above, increasing porosity effectively lowers dielectric constant. Accordingly, maximum advantage of the low k material's reduction of parasitic capacitance occurs with maximum porosity. This advantage is balanced against issues of mechanical, chemical and thermal stability during further processing, some of which issues can be resolved by techniques independent of adjusting porosity. While the methods disclosed herein can be applicable to insulating layers with any level of porosity, the porosity of the low k films 50, 56 is desirably greater than about 20%, more preferably greater than about 40% and most preferably greater than about 50%.

A less preferred porous low k material is a spin-on material commercially available under the trade name Nanoglass™ from Honeywell Advanced Microelectronic Materials (AMM) of Sunnyvale, Calif. (formerly Allied Signal). Nanoglass™ is a nanoporous silica with a k value between 2.5 and 1.3 for porosity levels of 50% to 90%. The currently available commercial version of Nanoglass™ has a dielectric constant value of about 2.0 with a porosity of about 70%. A study on an earlier version of Nanoglass™ (Nanoglass K2.2-A10B) found this less porous version of xerogel to have completely connected pores with an average pore size of about 4 nm (40 Å). Ryan et al., "Material property characterization and integration issues for mesoporous silica" *Proceedings of the IEEE* 1999 *International Interconnect Technology Conference* (1999), pp. 187-189. The skilled artisan will readily appreciate, however, that the methods disclosed herein are applicable to a variety of other materials having different levels of porosity.

The etch stop layers 54, 58 of the illustrated embodiment each comprise a material exhibiting different etch rates relative to the insulating layers 50, 56, allowing better control of etching processes. In the illustrated embodiment, the etch stop layers 54, 58 comprise silicon nitride (Si$_3$N$_4$), preferably provided to a thickness of between about 100 Å and 700 Å, and more preferably between about 200 Å and 500 Å. The lower barrier layer 51 preferably also comprises Si$_3$N$_4$. It will be understood that the etch-stop layers 54, 58 can also serve to strengthen the underlying porous insulating layers 50, 56. As disclosed in Ryan et al., cited in the previous paragraph, a 1,000 Å CVD oxide cap can be employed to improve resilience during subsequent CMP processing, and can also serve as the end-point when polishing overlying metal.

As discussed in the Background section above, after the lower insulating layer 50 and etch stop 54 are formed (FIGS. 5 and 6), a mask and etch process transfers a pattern of openings 55 (one shown in FIG. 7) to the etch stop 54. The second or upper insulating layer 56 and optional CMP stop 58 are then formed over the hard mask 54. As noted above, the etch stop 54 and CMP stop 58 layers need not be present in every embodiment.

Figure 9A:
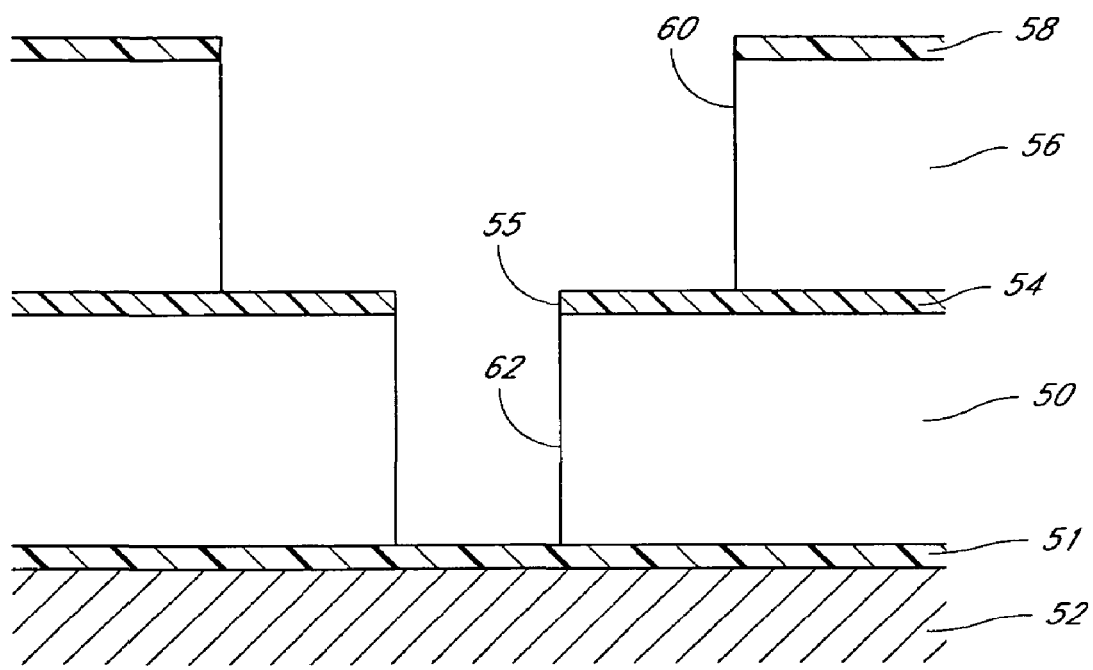
FIG. 9A shows the structure of FIG. 8 after trenches 60 (one shown) and contact vias 62 (one shown) have been etched to form a dual damascene structure.

With reference now to the embodiment depicted in FIG. 9a, the substrate is masked and trenches 60 (one shown) are etched through the upper insulating layer 56, preferably stopping on exposed portions of the first etch stop layer 54. As will be understood by the skilled artisan, the trenches 60 are etched across the insulating layer 56 in patterns desired for metal lines, in accordance with an integrated circuit design. In the illustrated embodiment, the width of the trench is less than about 0.35 μm, more preferably less than about 0.25 μm, and most preferably about 0.2 μm.

Continued etching through the hard mask 54 defines contact vias 62 (one shown) extending downwardly from the bottom of the trench and through the lower insulating layer 50 to expose conductive elements below (e.g., metal line 52). The contact vias 62 are defined by the openings 55 in the hard mask 54 at discrete locations along the trenches 60. Desirably, the contact vias 62 have a width of less than about 0.35 μm, more preferably between about 0.05 μm and 0.25 μm, and most preferably between about 0.05 μm and 0.18 μm. The width or the diameter of a contact via 62 can be equal to or slightly less than the line width defined by the trench 60 above.

The effective aspect ratio (depth: width) of the contact via 62 is therefore preferably greater than about 1:1. Since the effective depth of the contact via 62 is defined through both insulating layers 50, 56, the effective aspect ratio is more preferably greater than about 2:1, and most preferably between about 2:1 and 4:1. The preferred embodiments will have particular utility in connection with future generation devices, whereby line widths and contact widths will shrink even further. Advantageously, the employment of relatively thin low k dielectrics for the insulating layers 50, 56 reduces the aspect ratio relative to an equivalent design using conventional silicon oxides (k≈4).

As will be appreciated by one of skill in the art, the above description outlines merely one method of forming the trench and vias. In other embodiments, especially in those in which no etch stop layer is used (such as a VFTL method), the via can be formed first while the trench is formed afterwards.

With reference to FIGS. 9b to 9e, the preferred embodiments also have particular utility in conjunction with variations on the dual damascene structure of FIG. 9a. Parts similar to those of FIG. 9a will be referred to by like reference numerals.

Figure 9B:
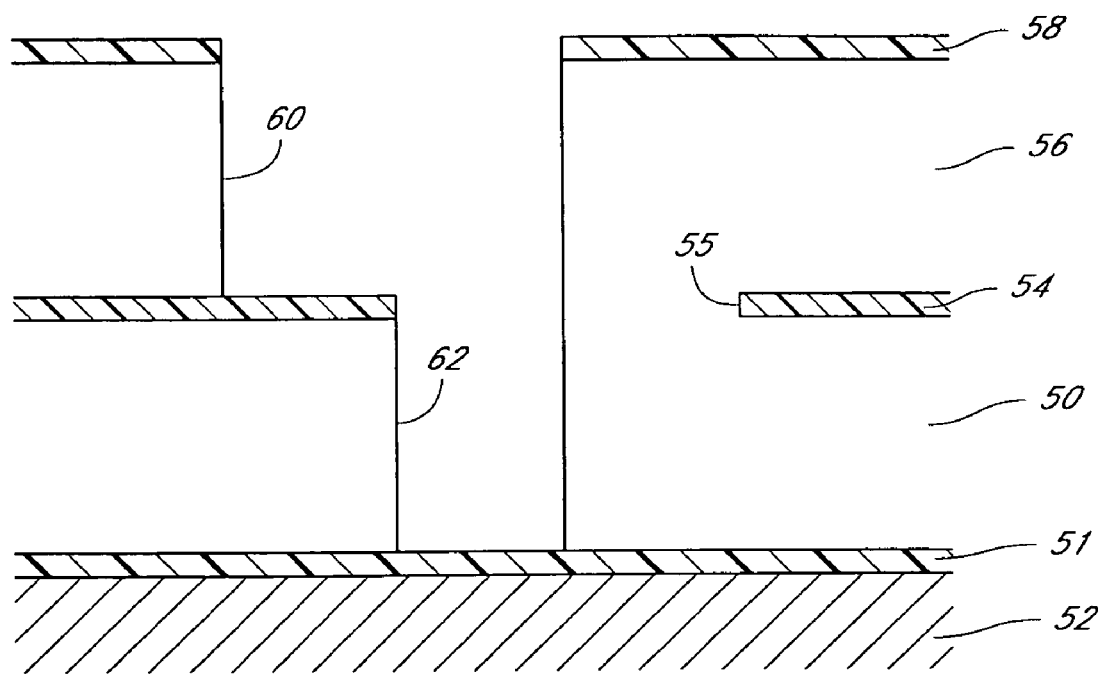
FIG. 9B through 9E show non-ideal damascene structures.

Referring to FIG. 9b, a non-capped dual damascene structure is shown. When non-capped vias 62 are allowed by design rules (and they are desirable for obtaining higher circuit densities), mask misalignment can lead to even greater aspect ratios. As one via sidewall is withdrawn from the corresponding edge of the opening 55 defined by the hard mask 54, the effective contact size decreases, such that aspect ratios can easily be double those listed above for the illustrated embodiment of FIG. 9a.

Figure 9C:
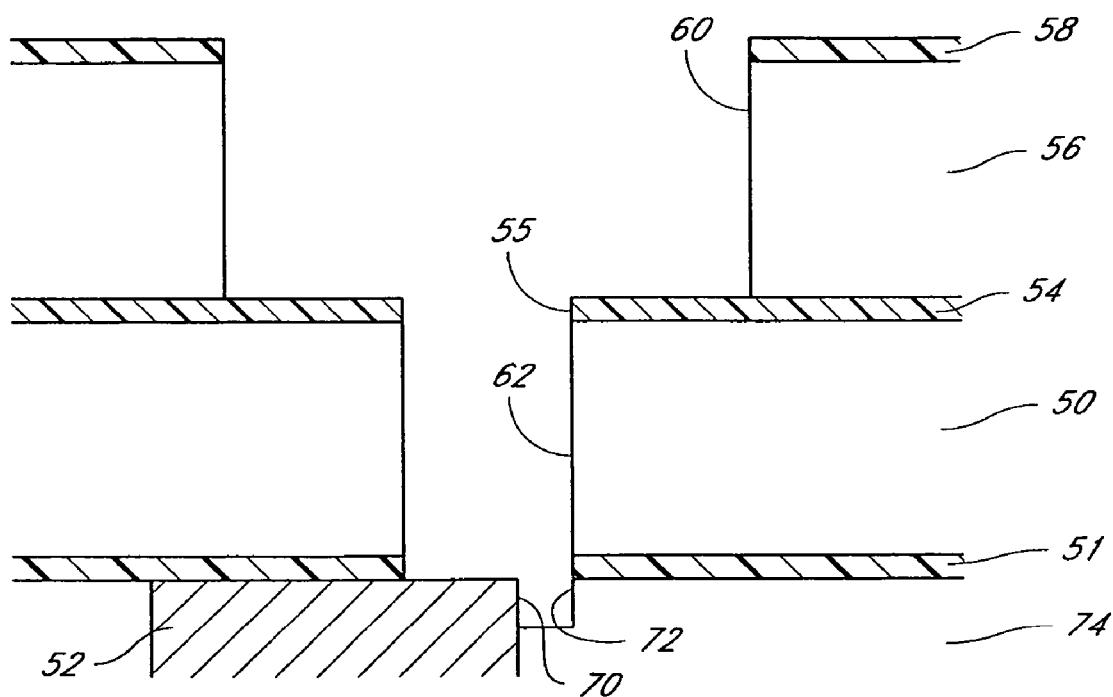

Referring now to FIG. 9c, vias that are not fully landed similarly exhibit higher effective aspect ratios. Under such circumstances, the opening 55 of the hard mask 54 overlaps with an edge 70 of the conductive circuit element 52. Small but very high aspect ratio overetch holes 72 are formed in an insulating or dielectric layer 74 surrounding the circuit element 52. The depth of the overetched hole 72 will depend, of course, on the etch selectivity between the barrier layer 51 and the surrounding dielectric 74.

Figure 9D:
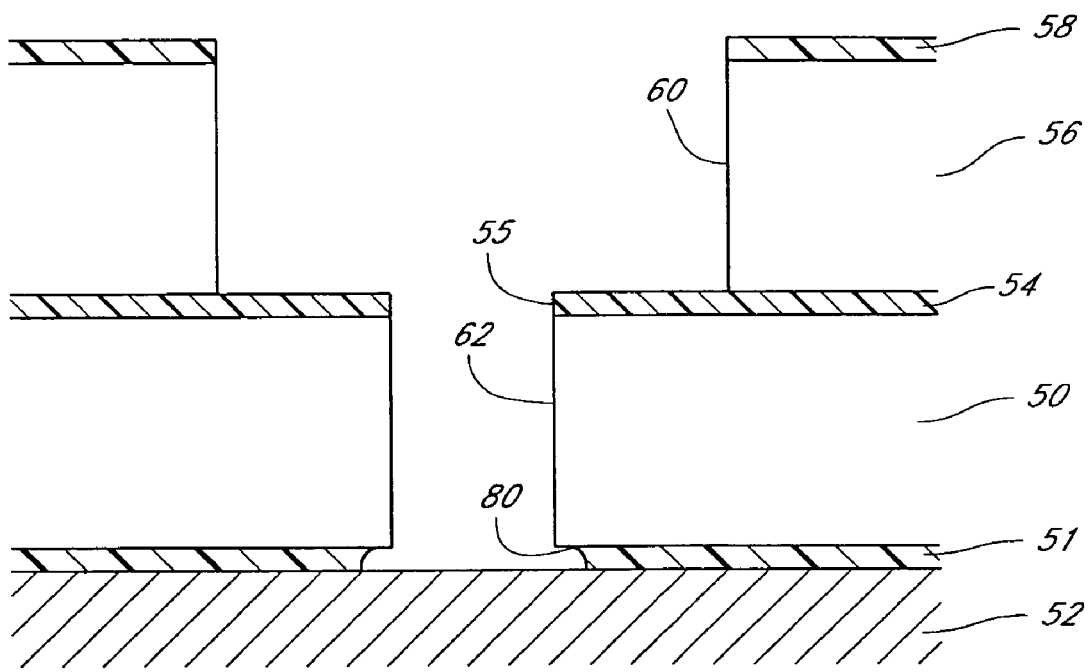

FIG. 9d illustrates the effect of undercutting the barrier layer 51 during via etch. When the barrier 51 is etched by a selective etch from the via bottom to expose the underlying circuit element 52, the barrier 51 tends to be laterally recessed. The resultant cavities 80 are very difficult to line by conventional processes.

Figure 9E:
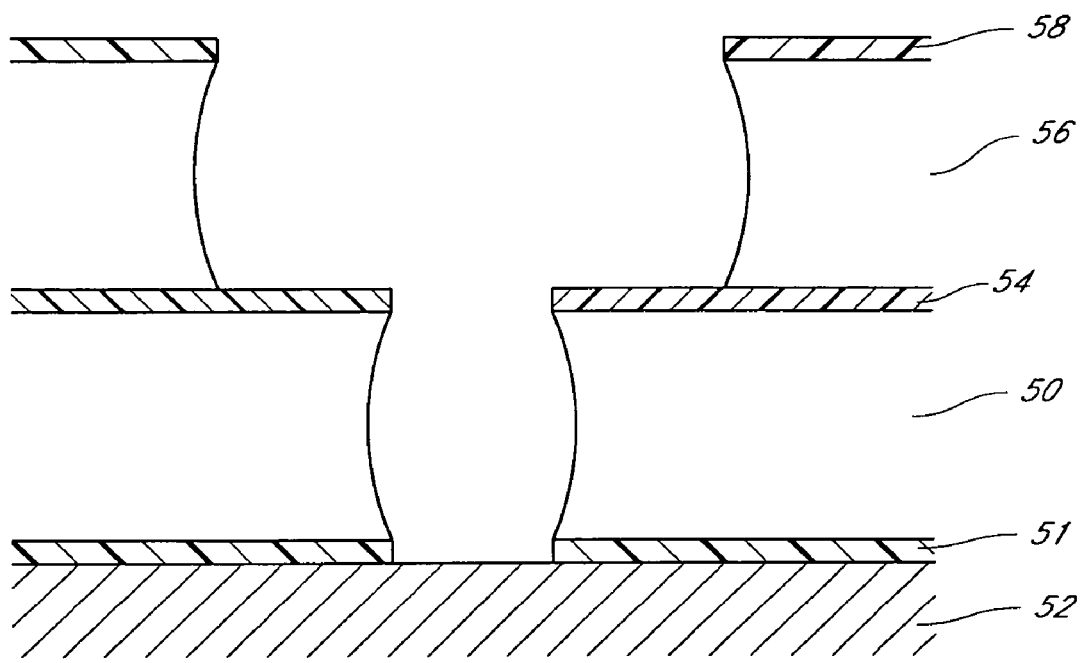

FIG. 9e illustrates yet another non-ideal damascene structure. When removing photoresist employed to pattern the structure, insulating layers 50, 56 formed of low k dielectrics are susceptible to attack, leaving a barrel-shaped profile in the trench 60 and via 61. This structure is also difficult to effectively line and fill by conventional processing.

Similarly, many other non-ideal conditions can result in other re-entrant profiles, cavities and/or extremely high aspect ratios for dual damascene trenches and vias. Under such circumstances, conventional processing is inadequate for lining and filling these structures without forming voids. The methods of the preferred embodiments, in contrast, can effectively line even the unusual or aberrant structures of FIGS. 9b to 9e. Moreover, the skilled artisan will readily find application for the methods and films disclosed herein beyond the dual damascene context. For example, the methods disclosed herein can also be used effectively for lining trenches in single damascene wiring schemes or for lining conventional contact vias and openings. The methods of lining have particular utility in conjunction with dual damascene process flows employing porous low k materials.

In other aspects, the layer which is to be plasma treated, need not be a low k insulating layer and can have different characteristics than what is described above. In some embodiments, the layer to be plasma treated is FSG (fluorinated silicate glass). In some embodiments, the layer to be plasma treated is TEOS (tetraethylorthosilicate).

Alternatively, in some embodiments, the layer or material to be plasma treated is a high k layer, such as $HfO_2$, $ZrO_2$, hafnium and zirconium silicates, barium strontium titanate (BST), strontium bismuth tantalate (SBT), etc. The high k layer will have a k of greater than 5 and preferably greater than 10. Such layers can be used in memory capacitors and as transistor gate dielectrics. Plasma treatment of such high k layers as taught herein will improve interfacial properties, particularly adhesion, with subsequently ALD-formed barriers such as the above-described metal nitride carbide, to serve as a barrier to oxygen diffusion.

Plasma Treatment of the Insulating Surface

As illustrated in FIG. 3, after formation 100, surfaces of the low k material (in the present embodiment including at least the sidewalls of the vias and trenches) are subjected to a plasma treatment process 101 that alters the surface of the low k insulating layer(s). Preferably, plasma treatment 101 comprises a $H_2$/He plasma treatment. A detailed discussion of this step is provided above and examples are provided further below. As noted above, in some embodiments, the plasma treatment not only treats the insulating sides of the trench for improved interface with a subsequent ALD barrier, but can also reduce metal oxide at the bottom of the via. Preferably, the treatment is isotropic.

Atomic Layer Deposition (ALD) Process

Following the plasma process, an ALD process is then performed directly on top of the plasma treated insulating layer. Preferably, each cycle forms no more than one monolayer of lining material by adsorption and preferably by chemisorption. The substrate temperature is kept within a window facilitating chemisorption. In particular, the substrate temperature is maintained at a temperature low enough to maintain intact bonds between adsorbed species and the underlying surface, and to prevent decomposition of the reactant species. On the other hand, the substrate temperature is maintained at a high enough level to avoid condensation of reactants and to provide the activation energy for the desired surface reactions in each phase. Of course, the appropriate temperature window for any given ALD reaction will depend upon the surface termination and reactant species involved.

Each pulse or phase of each cycle is preferably self-limiting in effect. In the examples set forth below, each of the phases are self-terminating (i.e., an adsorbed and preferably chemisorbed monolayer is left with a surface non-reactive with the chemistry of that phase). An excess of reactant precursors is supplied in each phase to saturate the structure surfaces. Surface saturation ensures reactant occupation of all available reactive sites (subject to physical size restraints, as discussed in more detail below), while self-termination prevents excess film growth at locations subject to longer exposure to the reactants. Together, saturation and self-terminating chemistries ensure excellent step coverage.

The step coverage is so high that, without precautions, the process could coat the pores of the preferred low k insulating layers with conductive reactants. Such a result risks conductive paths or short circuits through the insulating layers. Accordingly, the insulating layers are plasma treated to manipulate the surface of the via and trench sidewalls prior to the highly conformal ALD processes that line the dual damascene structure with conductive material. In a preferred embodiment, treating the pores occurs via a $H_2$/He plasma treatment.

A first chemistry is then supplied 104 to the workpiece. In a preferred embodiment, the first chemistry comprises a metal-containing compound that is reactive with the surfaces left by the previous step. Accordingly, a metal-containing species replaces or adsorbs upon the plasma treated surface. This metal-containing species layer is desirably self-terminating, such that any excess constituents of the first chemistry do not further react with the monolayer formed by this process. Preferably a halide or organic ligand terminates the metal-containing monolayer.

The metal-containing reactive species is preferably supplied in gaseous form, and is accordingly referred to hereinbelow as a metal source gas. In some examples, the reactive species actually has a melting point above the process temperature (e.g., in Table III below, CuCl melts at 430° C. while the process is conducted at about 350° C.). Nevertheless, the metal source gas is considered "volatile," for purposes of the present description, if the species exhibits sufficient vapor pressure under the process conditions to transport the species to the workpiece in sufficient concentration to saturate exposed surfaces.

The first chemistry is then removed 106 from the reaction chamber. In the illustrated embodiments, step 106 entails stopping the flow of the first chemistry while continuing to flow a carrier gas for a sufficient time to diffuse or purge excess reactants and reactant by-products out of the vias, trenches and the reaction chamber, preferably with greater than about two reaction chamber volumes of the purge gas, more preferably with greater than about three chamber volumes. In some embodiments, the removal 106 comprises continuing to flow purge gas for between about 0.1 seconds and 20 seconds after stopping the flow of the first chemistry. Inter-pulse purging is described in co-pending U.S. Pat. No. 6,511,539, issued Jan. 28, 2003 and entitled APPARATUS AND METHOD FOR GROWTH OF A THIN FILM, the disclosure of which is incorporated herein by reference. In other arrangements, the chamber may be completely evacuated between alternating chemistries. See, for example, PCT publication number WO 96/17107, published Jun. 6, 1996, entitled METHOD AND APPARATUS FOR GROWING THIN FILMS, the disclosure of which is incorporated herein by reference. Together, the adsorption 104 and reactant removal 106 represent a first phase 107 in an ALD cycle.

When the reactants of the first chemistry have been removed 106 from the chamber, a second chemistry is supplied 108 to the workpiece. The second chemistry desirably reacts with the self-terminated monolayer formed in step 104. In one embodiment, this reaction comprises supplying a nitrogen source gas to the workpiece. Nitrogen or nitrogen-containing species from the nitrogen source gas preferably reacts with the previously adsorbed metal-containing species to leave a metal nitride in place of the metal-containing monolayer.

In other arrangements, the second chemistry may simply scavenge or remove the ligand termination of the adsorbed metal complex monolayer formed in step 104 (e.g., by ligand-exchange, sublimation or reduction) or otherwise prepare the monolayer for deposition/adsorption of a further monolayer and/or reaction with a further chemistry (see, e.g., Table III below). Desirably, the reaction 108 is also self-limiting. Reactants saturate the limited number of reaction sites left by step 104. Temperature and pressure conditions are preferably arranged to avoid diffusion of reactants from the second chemistry through the monolayer to underlying materials. The second chemistry also leaves a surface termination that operates to limit the deposition in a saturative reaction phase.

After a time period sufficient to completely saturate and react the metal-containing monolayer with the second chemistry, the second chemistry is removed 110 from the workpiece. As with the removal 106 of the first chemistry, this step 110 preferably comprises stopping the flow of the second chemistry and continuing to flow carrier gas for a time period sufficient for excess reactants and reaction by-products from the second chemistry to diffuse out of the vias and trenches of the damascene structure and be purged from the reaction chamber. For example, reactants and reaction by-products can be removed by flowing purge gas after stopping the flow of the second chemistry, preferably with at least about two chamber volumes of purge gas and more preferably with at least about three chamber volumes. In some embodiments, the removal 110 comprises continuing to flow purge gas for between about 0.1 seconds and 20 seconds after stopping the flow of the second chemistry. Together, the reaction 108 and removal 110 represent a second phase 111 in an ALD cycle.

In a preferred embodiment, there is a third phase 311 in the ALD cycle 115 before the cycle starts over again. It preferably follows the end of the second phase 110 and involves adding a further chemistry (a third chemistry) in another self-limiting monolayer 308. The third chemistry desirably reacts with the self-terminated monolayer formed in step 108. The third chemistry is preferably carbon based, e.g., triethyl boron (TEB), trivinyl boron, triisopropyl boron, triisobutyl boron, tertiarybutyl boron and/or other trialkylboron compound). Temperature and pressure conditions are again preferably arranged to avoid diffusion of reactants from the third chemistry through the monolayer to underlying materials. The third chemistry also leaves a surface termination that operates to limit the deposition in a saturative reaction phase. This surface termination can serve to allow binding with the first chemistry 104 during the start of the next cycle. After a time period sufficient to completely saturate and react the nitrogen containing monolayer with the third chemistry, the third chemistry is removed from the workpiece 310. As with the removal 106 of the first chemistry, and the removal 110 of the second chemistry, this step preferably comprises stopping the flow of the third chemistry and continuing to flow carrier gas for a time period sufficient for excess reactants and reaction by-products from the third chemistry to diffuse out of the vias and trenches of the damascene structure and be purged from the reaction chamber.

In some embodiments, where three phases are alternated once the excess reactants and by-products of the third chemistry have diffused out of the vias and trenches, and preferably out of the reaction chamber, the first phase 107 of the ALD process is repeated. Accordingly, again supplying 104 the first chemistry to the workpiece forms another self-terminating monolayer.

The three phases 107, 111, and 311 thus represent a cycle 115 repeated to form monolayers in an ALD process. The first chemistry 104 generally reacts with the termination left by the third chemistry 308 in the previous cycle. If necessary, the cycle 115 can be extended to include a distinct surface preparation. The cycle of all three phases then continues through steps 104, 106, 108, 110, 308, and 310. This cycle of all three phases is repeated a sufficient number of times to produce a lining layer within the dual damascene structure of a thickness sufficient to perform its desired function. In a preferred embodiment, a carbon phase is administered to the surface before any other phase, and then the cycle proceeds as described above (e.g., a tungsten phase, a nitrogen phase, and a carbon phase).

Though illustrated in FIG. 3 with only first, second, and third chemistries, it will be understood, that, in other arrangements, additional chemistries can also be included in each cycle (see, e.g., discussion above). Furthermore, though illustrated with an initial metal phase and subsequent nitrogen and carbon phases in the examples below, it will be understood that the cycle can begin with the nitrogen or carbon phase, depending upon the surfaces and phase chemistries. Additionally, the nitrogen and carbon phases can be swapped. Additionally, not all 3 phases need to be included in every embodiment, or in the same amount. The relative amounts of the amounts can be adjusted by adjusting the frequency of the phases or by selection of the precursors (e.g., reactants having large ligands result in less reactant remaining and reactants with smaller ligands results in more of the reactant in each layer.) As will be appreciated by one of skill in the art, a complete cycle can be thought of any combination of all three phases (in a three phase cycle). Thus, a section deposited by a carbon phase, a tungsten phase, a nitrogen phase, and a second carbon phase has at least two variations of a cycles (C, W, N, with a final layer of carbon or W, N, C with a pre-treatment of carbon).

Figure 4:
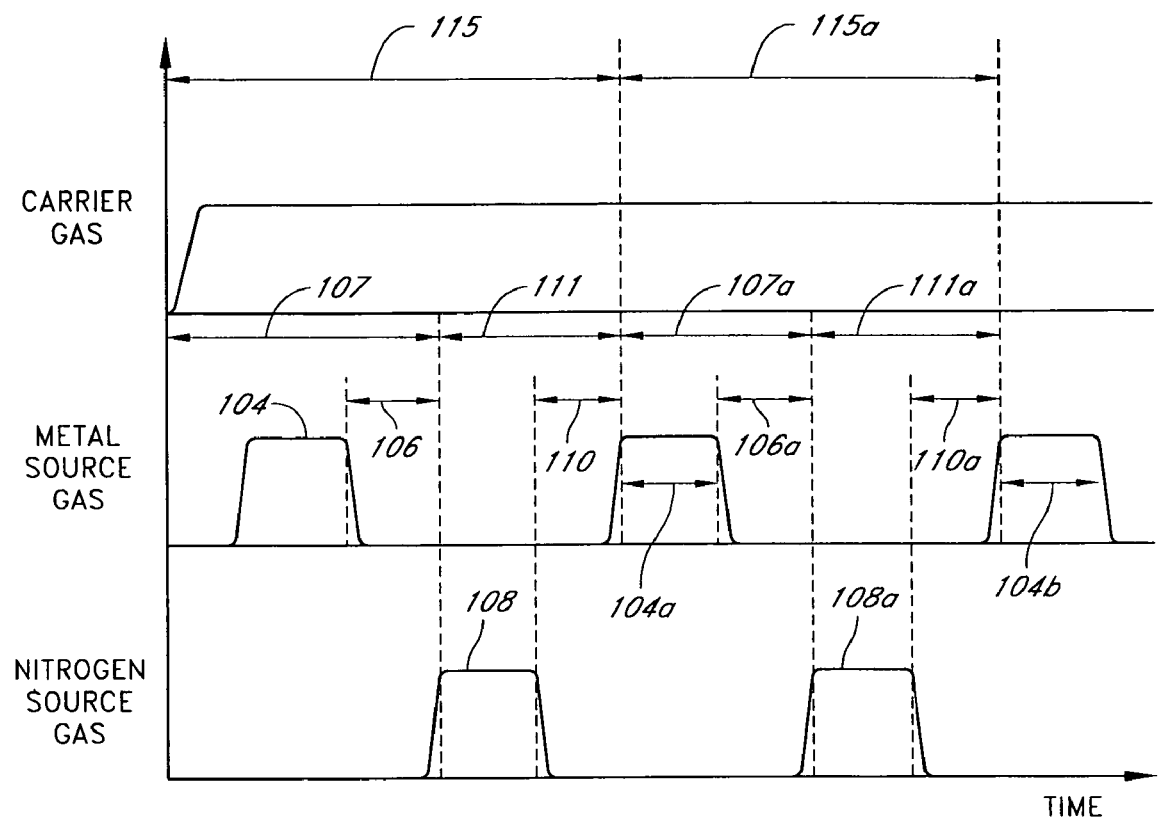
FIG. 4 is an exemplary gas flow diagram for a two-reactant atomic layer deposition process.

FIG. 4 illustrates a process for forming a metal nitride barrier layer lining the structures of FIGS. 9A to 9E. For simplicity, like reference numerals are employed to refer to the phases and steps of the metal nitride examples (FIG. 4) that correspond to the general description of FIG. 3. However, FIG. 4 only demonstrates the first two phases. One of skill in the art can readily adjust the method depicted in FIG. 4 for the full process described herein and in FIG. 3. In a preferred embodiment, the layer is placed directly on the surface of the plasma treated surface.

With reference to FIG. 4, a gas flow sequence is represented in accordance with a particular embodiment. In the illustrated example, a conductive nitride, and more particularly a metal nitride, is formed by supplying the workpiece with a metal source gas alternately with a nitrogen source gas. The first or metal phase 107 of each cycle chemisorbs a layer of metal-containing material, desirably in the absence of the nitrogen source gas. The second or nitrogen phase 111 of each cycle reacts or adsorbs a nitrogen-containing material on the deposited metal-containing layer, desirably in the absence of the metal source gas. It will be understood that, in other arrangements, the order of the phases can be reversed, and that the reactant removal or purge steps can be considered part of the preceding or subsequent reactant pulse.

Surfaces of the damascene structure upon which the lining material is to be formed can be initially terminated to provide a surface that is reactive with the metal source gas. The preferred metal layer can be terminated, for example, with $NH_3$ to facilitate chemisorption of the reactant pulses discussed below.

Most preferably, the metal phase 107 is self-limiting, such that no more than about one atomic monolayer is deposited during the first phase. Desirably, a volatile metal source gas is provided in a pulse 104. Exemplary metal source gases include tungsten hexafluoride ($WF_6$).

After a sufficient time for the metal source gas to diffuse into the bottom of the dual damascene contact via, shutting off the flow of the metal source gas ends the metal pulse 104. Preferably, carrier gas continues to flow in a purge step 106 until the metal source gas is purged from the chamber.

During the pulse 104, the metal source gas reacts with exposed and terminated surfaces of the workpiece to deposit or chemisorb a "monolayer" of metal-containing species. While theoretically the reactants will chemisorb at each available site on the exposed layer of the workpiece, physical size of the adsorbed species (particularly with terminating ligands) will generally limit coverage with each cycle to a fraction of a monolayer.

The metal-containing species deposited/adsorbed upon the workpiece is self-terminating such that the surface will not further react with the metal source gas. In the example set forth below $WF_6$ (Table I) leaves a monolayer of fluorine-terminated tungsten. Similarly, other volatile metal halides will leave halide-terminated surfaces, and metal organics. Such surfaces do not further react with the metal source or other constituents of the reactant flow during the metal source gas pulse 104. Because excess exposure to the reactants does not result in excess deposition, the chemistry during the metal phase 107 of the process is said to be self-limiting or self-saturating. Despite longer exposure to a greater concentration of reactants, deposition over upper surfaces of the workpiece does not exceed deposition over the via floor.

In a second phase 111 of the cycle 115, a pulse 108 of a nitrogen source gas is then provided to the workpiece. In other arrangements, the second phase can be carbon. In the illustrated examples, the nitrogen source gas comprises ammonia. In other embodiments, other sources of nitrogen can be used, for example salts of ammonia, hydrogen azide, hydrazine, nitrogen fluoride, primary, secondary, and tertiary amines, and nitrogen radicals such as $NH_2*$, $NH$ and $N*$ where "*" designates a free electron capable of forming a bond. Preferably, the second phase 111 is maintained for sufficient time to fully expose the monolayer of metal-containing species left by the first phase 107 to the nitrogen source gas. After a sufficient time for the nitrogen source gas to diffuse into the bottom of the dual damascene contact via, shutting off the flow of the metal source gas ends the nitrogen pulse 108. Preferably, carrier gas continues to flow in a purge step 110 until the nitrogen source gas is purged from the chamber.

During the nitrogen pulse 108, the nitrogen source gas reacts with or chemisorbs upon the self-terminated metal monolayer left by the first phase 107. This chemisorption can comprise a saturative ligand-exchange reaction, replacing the halogen termination of the metal monolayer with a nitrogen-containing species. A metal nitride is thereby formed, preferably in a single monolayer. Desirably, the process leaves a stoichiometric metal nitride. As discussed with respect to the metal phase 107, the monolayer need not occupy all available sites, due the physical size of the adsorbed species. However, the second phase 111 also has a self-limiting effect.

In particular, the nitrogen source gas reacts with the metal-containing species chemisorbed onto the workpiece surface during the previous pulse of metal source gas. The reaction is also surface terminated, since ammonia during the pulse 108 will not react with nitrogen and $NH_x$ tails terminating the metal nitride monolayer. Moreover, temperature and pressure conditions are arranged to avoid diffusion of ammonia through the metal monolayer to underlying materials. Despite longer exposure to a greater concentration of reactants in this saturative, self-limiting reaction phase 111, the thickness of the metal nitride formed on upper surfaces of the workpiece does not exceed the thickness of the metal nitride formed on the via floor.

In some embodiments, the metal phase 107 (including metal source pulse 104 and purge 106) and nitrogen phase 108 (including nitrogen source pulse 108 and purge 110) together define a cycle 115 that is repeated in an ALD process. However, in a preferred embodiment, the cycle comprises three phases.

In particular, the preferred barrier layer comprises three phases; the metal 107 and nitrogen 111 phases described above, and then a carbon phase 311. The carbon 308 is then used as a base for the next metal 104a. In a more preferred embodiment, the metal is tungsten; thus, the barrier layer comprises tungsten, nitride and carbide, each cyclically placed upon each other. In a preferred embodiment, the first phase deposited directly on the insulator is a carbon phase, followed by a complete cycle of a tungsten, a nitrogen and a carbon phase. Preferably the cycle is repeated multiple times until a desired number of cycles or height of layers is achieved. In some embodiments, the barrier layer is about 10-100 angstroms, more preferably about 20-60 angstroms, yet more preferably less than about 45 angstroms and most preferably about 35-45 angstroms thick.

As will be appreciated by one of skill in the art, the thickness of these barrier layers, given their resulting properties, can be much less than a typical barrier layer in which the insulating layer has not been properly treated with a proper plasma technique. Thus, in some embodiments the thickness of the barrier layer can be reduced by 40-80 percent, more preferably, by 50-70 percent and most preferably by 55-65 percent of what would be required to have the same barrier properties. Additionally, as this process does not require that an additional sealing layer be placed on top of the insulating material, the overall thickness of the lining can also be reduced a corresponding amount, i.e., the barrier is preferably directly on the treated surface. Thus, methods and the resulting compositions from those methods, include layers (e.g., barrier layers) on insulating layers that are especially thin while having properties previously associated with thicker layers (e.g., superior resistance and longer lifetimes).

EXAMPLES

The description below provide exemplary process recipes for forming metal nitride layers suitable for barrier applications in dual damascene metallization schemes for integrated processing. The process recipes represents one cycle in a single-wafer process module. In particular, the illustrated parameters are developed for use in the single-wafer ALD module commercially available under the trade name Pulsar 3000™ from ASM America, Inc., Phoenix Ariz.

Note that the parameters in the tables below are exemplary only. Each process phase is desirably arranged to saturate the via and trench surfaces, and more particularly to saturate the plasma treated surface of the insulating layer. Purge steps are arranged to remove reactants between reactive phases from the substrate. The examples herein can be conducted upon planar, unpatterned wafer surfaces in a POLYGON™ cluster tool available from ASM International, N.V. of Bilthoven, the Netherlands. Similar ALD processes have been determined to achieve better than 90% step coverage and more preferably >95% in openings with aspect ratios of greater than about 20. In view of the disclosure herein, the skilled artisan can readily modify, substitute or otherwise alter deposition conditions for different reaction chambers and for different selected conditions to achieve saturated, self-terminating phases at acceptable deposition rates. Due to the plasma treatment, this high conformality ALD process exhibits excellent interface properties between the barrier and the insulating surfaces, with minimal thickness and yet highly effective barrier properties, as demonstrated by the attached lifespan and failure data.

Advantageously, the ALD processes described herein are relatively insensitive to pressure and reactant concentration, as long as the reactant supply is sufficient to saturate the trench and via surfaces. Furthermore, the processes can operate at low temperatures.

TABLE I

| Phase | Carrier Flow (slm) | Reactant | Reactant Flow (sccm) | Temperature (° C.) | Pressure (Torr) | Time (sec) |
|---|---|---|---|---|---|---|
| carbon | 600 | TEB | 200 | 300 | 10 | 1.0 |
| purge | 600 | — | — | 300 | 10 | 1.0 |
| metal | 600 | $WF_6$ | 50 | 300 | 10 | 0.25 |
| purge | 600 | — | — | 300 | 10 | 0.25 |
| nitrogen | 600 | $NH_3$ | 100 | 300 | 10 | 0.5 |
| purge | 600 | — | — | 300 | 10 | 1.0 |

Table I above presents parameters for ALD of tungsten nitride carbide (WNC). As noted, the metal source comprises tungsten hexafluoride ($WF_6$), the carrier gas comprises nitrogen ($N_2$), the nitrogen source gas preferably comprises ammonia ($NH_3$), and the carbon source is triethylboron (TEB). During each of the reaction phases, the reactants are supplied in sufficient quantity for the given other parameters to saturate the surface.

In this case, TEB is first pulsed into the reaction chamber. Next, the metal monolayer is formed in the metal phase and is self-terminated with fluoride, which does not readily react with $WF_6$ under the preferred conditions. Next, the preferred nitrogen source gas reacts with or adsorbs upon the fluoride-terminated surface during the nitrogen phase in a reaction limited by the limited supply of tungsten fluoride complexes previously adsorbed. Moreover, nitridation leaves a nitrogen and $NH_x$ termination that does not further react with excess ammonia in the saturative phase. This establishes a single complete monolayer as a layer of carbon, a layer of tungsten and a layer of nitrogen, the nitrogen layer can be reacted with TEB to initiate the cycle over again. The first pulse of TEB may or may not leave carbon, but in any event serves also as a reducing agent to clean any remaining metal oxide at the via floor. Subsequent pulses of TEB will leave carbon in the film.

Improved Barrier Properties

The WNxCy barrier layer formed on a plasma treated insulating surface demonstrated several improved barrier properties compared to a similar barrier layer placed on an insulating layer that had not been treated by adequate or any plasma processing. The following section discusses these improved properties, the methods that result in circuits with these improved properties, and the circuits formed with such methods. In general, optimization of the circuits can be done through a direct comparison of various circuits with various barriers, with and without plasma treatment, and with different plasma treatments.

WNC Barrier/Plasma Treated Insulating Layer

A trench and via were formed by patterning and etching in a siloxane insulating layer. Following a vacuum break, the insulating surface in which the trench and via are formed were exposed to $H_2$ and He plasma processing for a period of time sufficient to result in the desired characteristics (e.g., an improved barrier property compared to barriers on top of untreated insulating layers), in this example, approximately 10 seconds. Following this, a $WN_xC_y$ barrier approximately 40 angstroms thick was created by 60 cycles of ALD. In alternative embodiments, the barrier layer can be thicker or thinner, e.g., about 30-50 angstroms or 35 to 45 angstroms thick. Following another vacuum break, a copper seed layer, approximately 800 angstroms thick was added to the layer via PVD. Following this, a copper layer was electroplated into the trench and vias. This barrier is identified as "barrier 1" or "barrier 1A" in the results and comparisons discussed in greater detail below. In alternative embodiments, there is no vacuum break between the steps. This can be achieved in a variety of ways, for example, through the use of a cluster tool (e.g., POLYGON™ from ASM International of Bilthoven NL). In an alternative embodiment, a machine that is designed specifically for the above method is used. For example, the device can have a chamber for in situ plasma treatment, a separate chamber for the ALD process and a third chamber for the copper deposition step. The device can allow transfer between the chambers under vacuum; thus, there is no risk of accidental oxidation of any surface between the steps. This can be achieved in a variety of ways, for example, enclosing a space in the form of a transfer chamber between the chambers and maintaining the transfer chamber under vacuum while the substrate moves among the chambers for sequential processing. Alternatively, the device may perform a vacuum step before each of the steps is performed.

The resulting characteristics and improved barrier properties of this integrated circuit were tested in a variety of ways. Changes in the electro-migration characteristics were measured in the plasma treated circuit. For a given circuit structure (e.g., a first metal of 0.2 micrometers, a second metal of 0.2 micrometers, and a via of 0.18 micrometers, under given conditions (e.g., a model of use such as a current density of $5.5*10^5$ A/cm$^2$ at a temperature of 110° C.), and with a given failure definition (e.g., 20% deviation from initial resistance), the plasma treated circuit's lifetime was analyzed. With the conditions noted above, the plasma treated versions of the circuit were expected to last dramatically longer than 10 years, see Table II.

TABLE II

| Structure | # samples | MTTF (hrs) | σ | Lifetime 0.1% (years) |
|---|---|---|---|---|
| M1 | 15 | 73 | 1.183 | 19.9 |
| M2 | 15 | 53.4 | 1.121 | 17.6 |
| M1V1M2 | 15 | 17.2 | 0.635 | 25.2 |

Figure 10A:
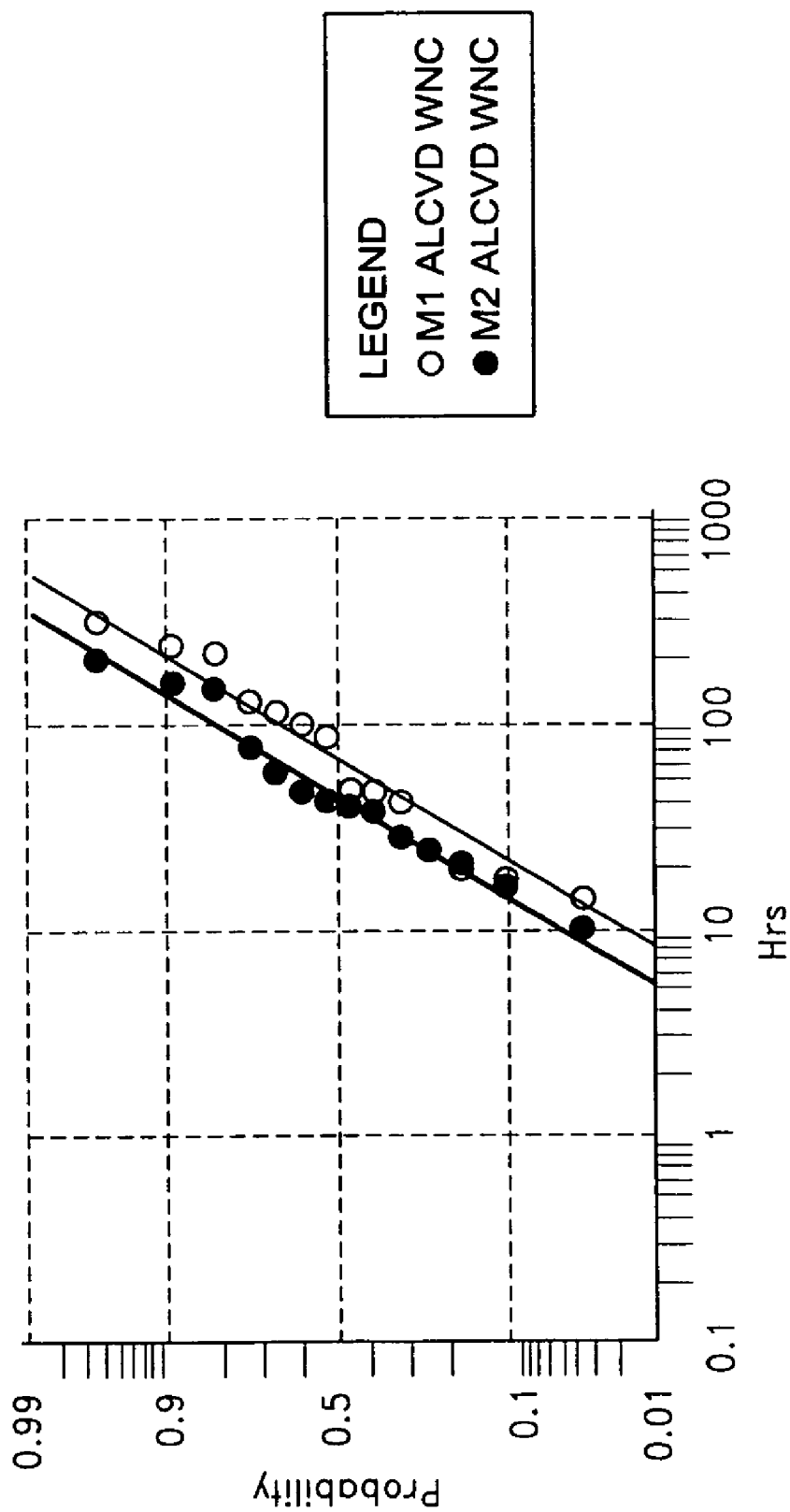
FIG. 10A is a graph depicting the electromigration related interconnect reliability formed in damascene trenches in a plasma treated low-k material.
Figure 10B:
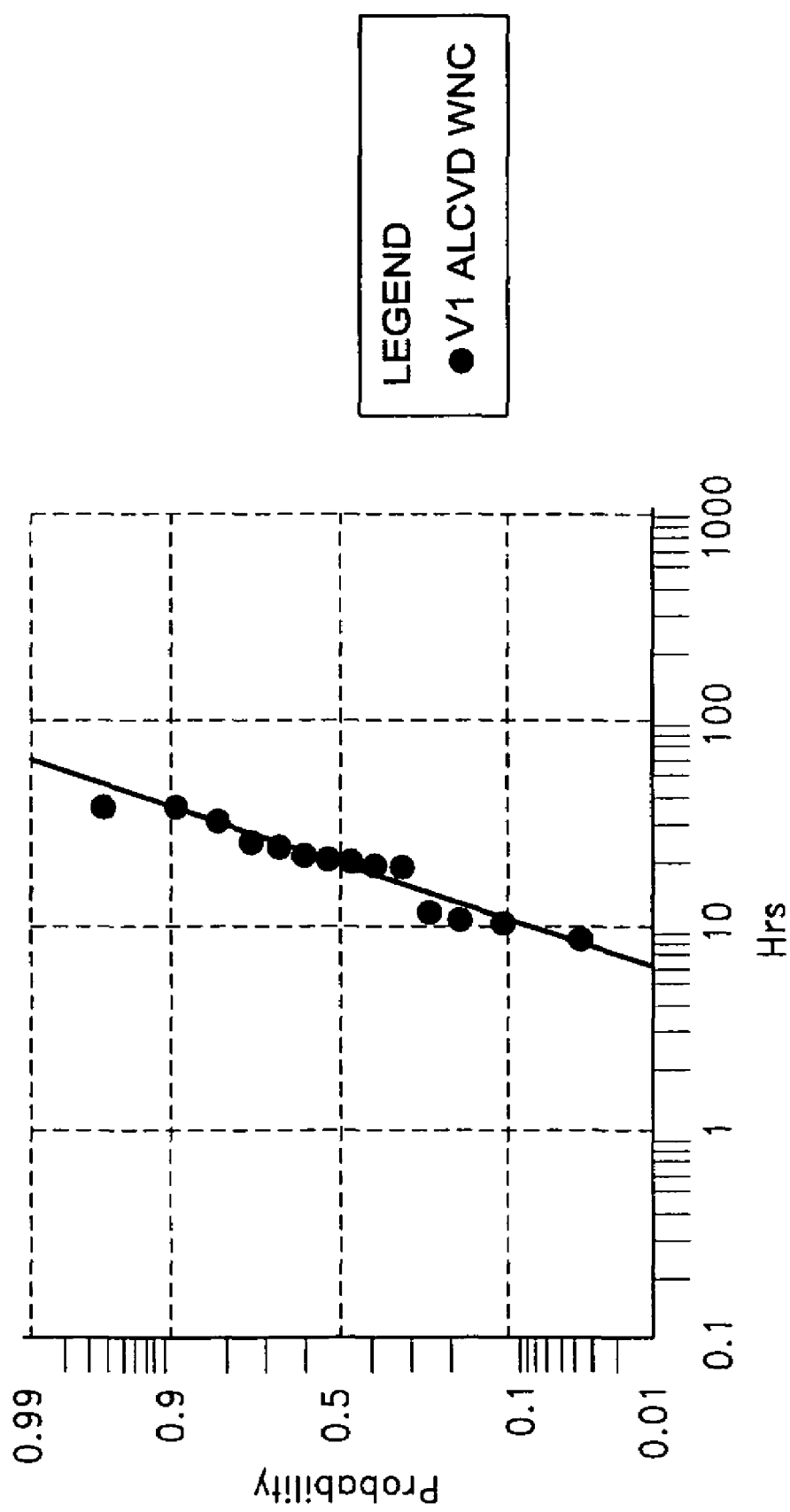
FIG. 10B is a graph depicting the electromigration related interconnect reliability formed in a plasma treated low-k material.

Furthermore, the resulting failure probability as a function of time is shown in FIG. 10A and FIG. 10B.

Non-He/$H_2$ Plasma Treated Circuits with Barrier Layers

The comparison to see if the resulting plasma treated insulating layer had improved properties also involved a comparison of the He/$H_2$ plasma treated circuits with alternative integrated circuits (e.g., circuits treated with different plasmas, no plasma, different barrier layers, etc.) The following paragraphs briefly describe some of the various circuits with which the plasma treated circuit was compared.

One non-plasma treated circuit had a trench and via formed in a similar manner as described above and similarly underwent a vacuum break; however, a WNC layer (similar to the one above) was then immediately applied to the insulating surface, followed by another vacuum break, a similar seed layer, and similar electroplating steps. Thus, the only difference between this circuit and the plasma treated circuit was the plasma treatment. This circuit is denoted as "barrier 2" in the discussion below.

Another circuit with a different barrier layer was also prepared for a comparison with the He/$H_2$ plasma treated circuit. Following the initial vacuum break after the trench and via are formed, a Ta/TaN layer was added to the insulating layer via PVD (e.g., approximately 100 angstroms deep), followed by a similar seed layer and a similar electroplating step. This circuit is identified as "barrier 3" in the comparisons below.

Another circuit was prepared that was identical to the WNC plasma treated example described above, except that it employed a different type of plasma (e.g., a $NH_3$ plasma instead of the $H_2$/He plasma described above). As described below, treatment with a different plasma resulted in very different barrier properties. Thus, not all plasma treatments are equivalent. Given this example and the discussion provided herein, one of skill in the art will be able to determine which plasmas are adequate and which are not. This circuit is identified as "barrier 1B" in the comparisons below.

Figure 11:
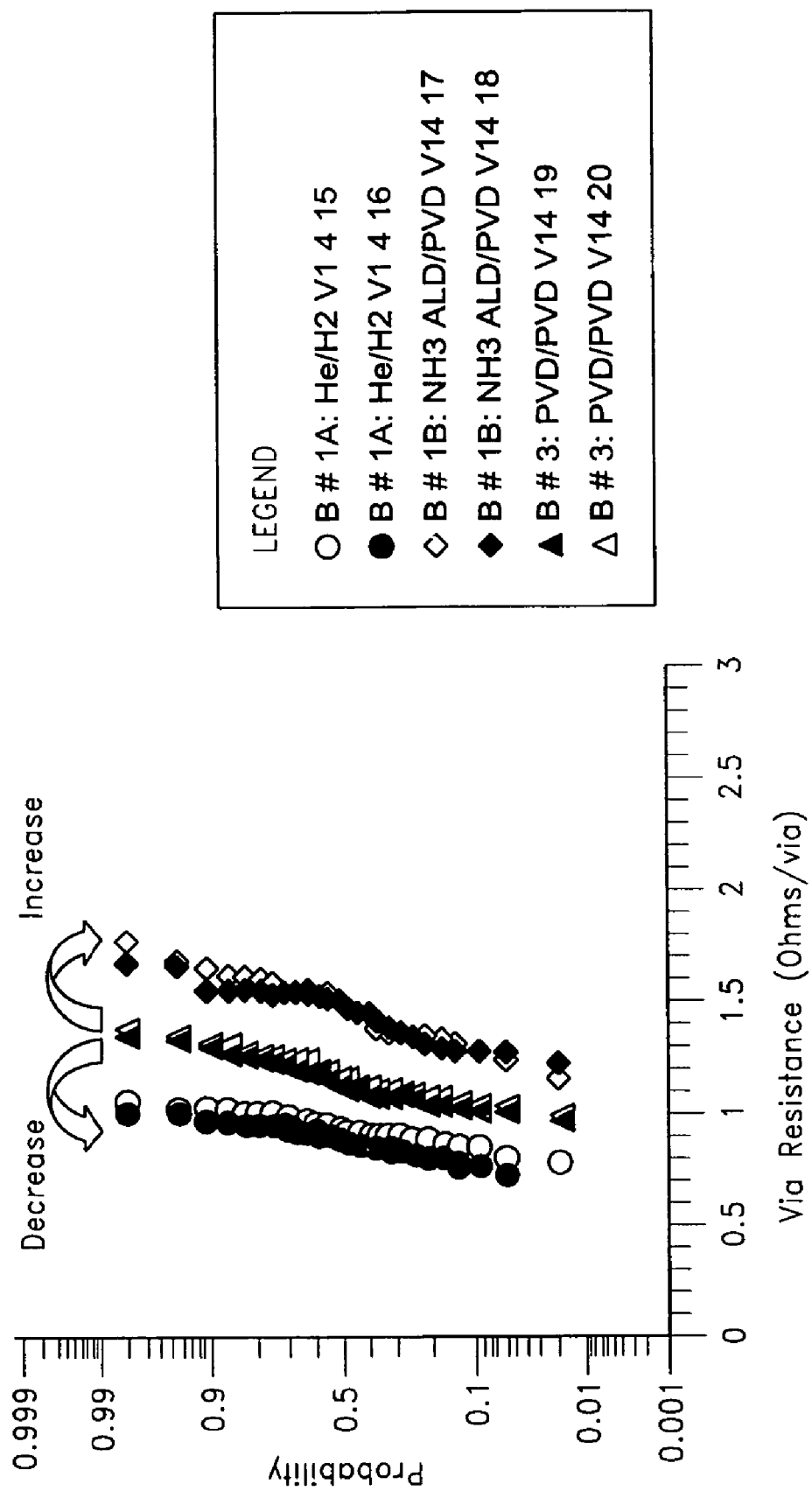
FIG. 11 is a graph comparing the via resistance of various circuits.
Figure 12:
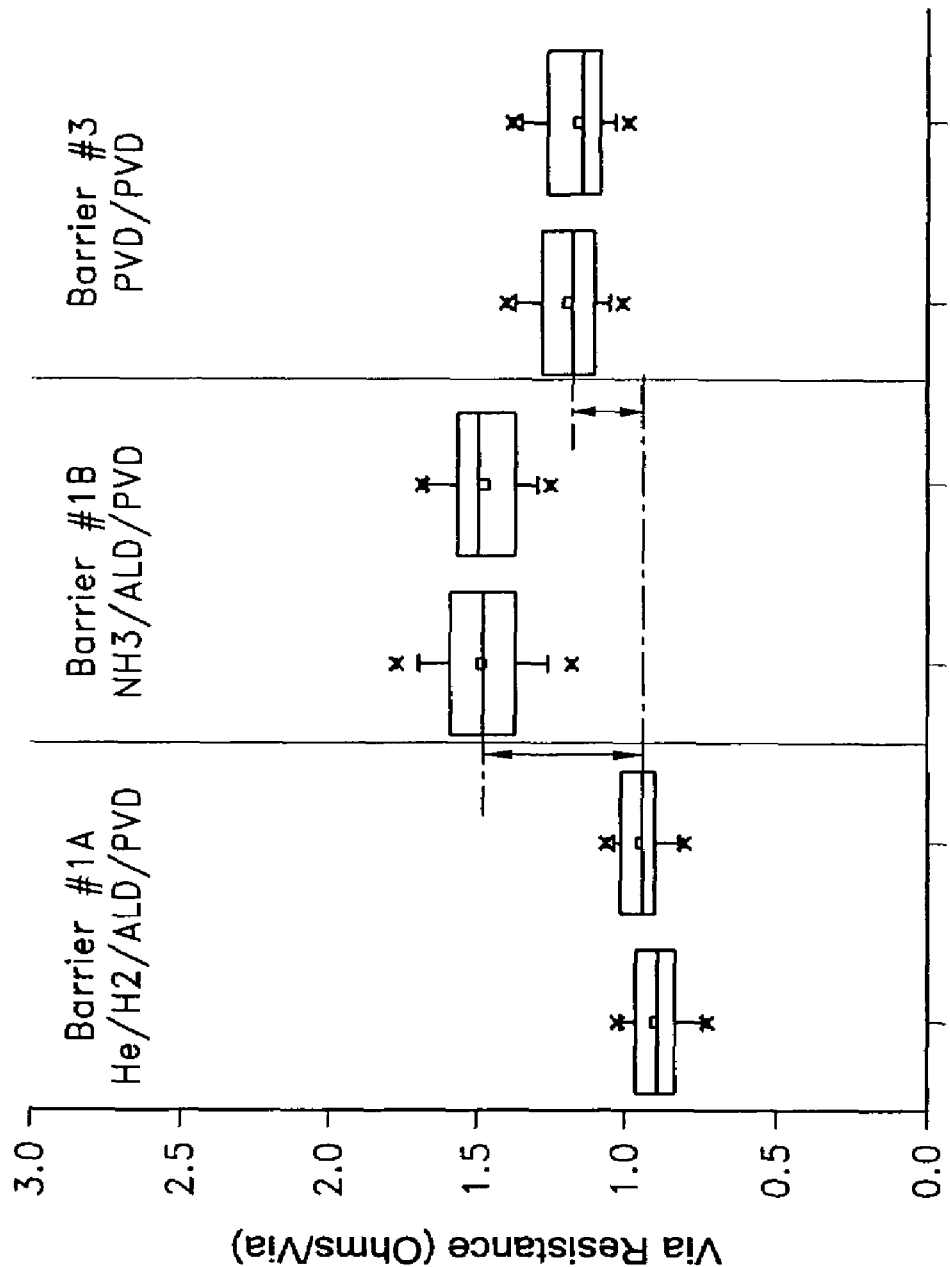
FIG. 12 is a bar graph comparing the via resistance and variability for various interconnect structures, including damascene interconnects formed in a $He/H_2$ plasma treated insulator.

A comparison of these various circuits is shown in FIG. 11, which clearly demonstrates that He/$H_2$ plasma results in significantly lower resistance compared to the vias created without or with a different plasma treatment. Indeed, the lowest via chain resistance was observed in the $H_2$/He plasma engineered/ALCVD $WN_xC_y$ structures. The structure tested was a dual damascene M2 (0.2 microns)+V1 (0.18 microns)+M1 (0.2 micron) structure and the barrier was fabricated on a product of the AURORA® process. The metal was copper. This lower resistance is further depicted in FIG. 12. FIG. 12 demonstrates that the He/$H_2$ plasma treatment resulted in the tightest distribution of resistance results and the lowest resistance compared to the other examples tested.

Figure 13A:
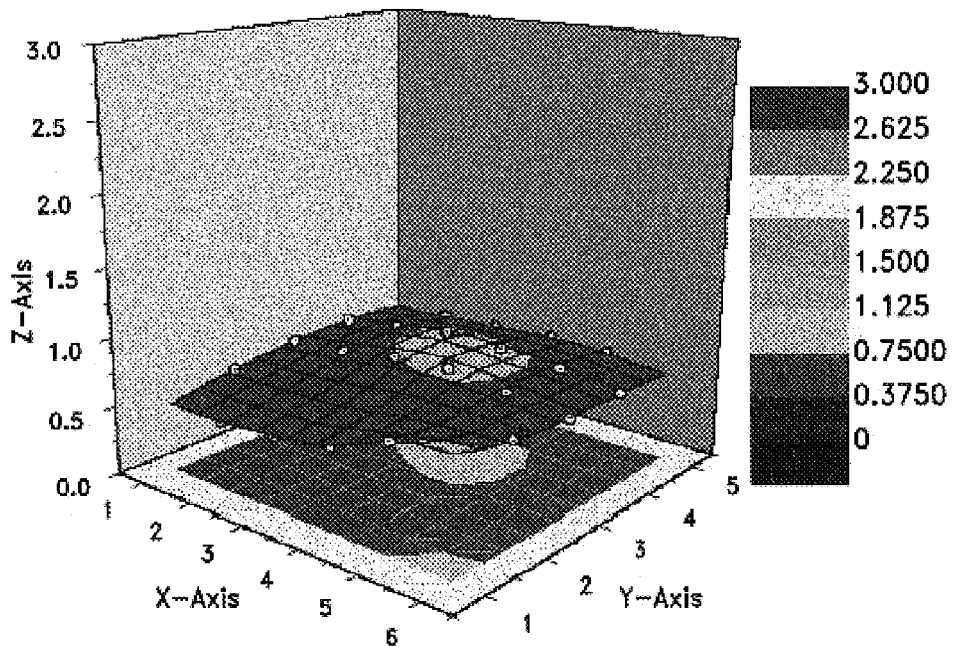
FIG. 13A is a graph depicting the lower resistance and greater uniformity for metal formed in the $He/H_2$ plasma treated insulators, compared to untreated insulators.
Figure 13B:
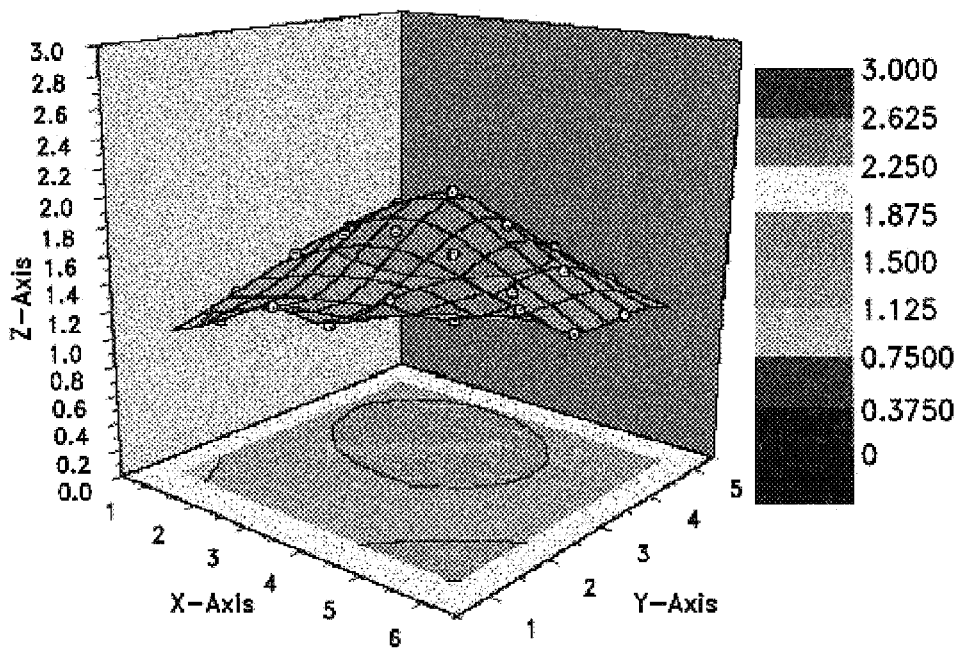
FIG. 13B is a graph depicting the higher resistance and lower uniformity of the circuit formed in an insulator that has not been treated with the $He/H_2$ plasma.

Additionally, the uniformity of resistance in the He/$H_2$ plasma treated circuit was also superior to that of the untreated circuit (compare, FIG. 13A, depicting the He/$H_2$ plasma treated circuit vs. FIG. 13B, depicting the identical circuit, without the plasma treatment). As can be observed from the graph, the plasma treated circuit displays a lower resistance and that lower resistance is, relatively, highly uniform.

Figure 14:
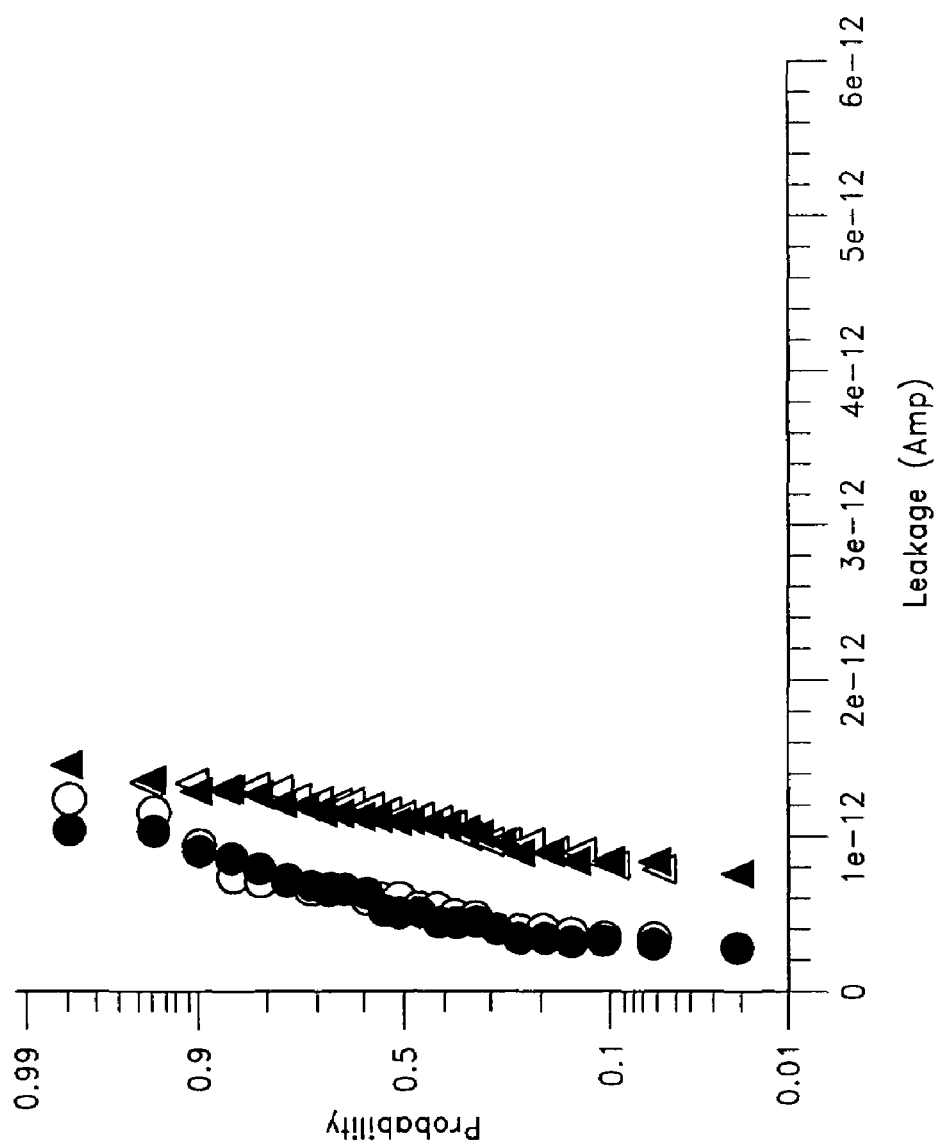
FIG. 14 is a graph comparing the leakage characteristics of various circuits.

Additionally, the amount of leakage between different circuits was compared. As shown in FIG. 14, the plasma treated circuit demonstrated a superior leakage profile (less leakage) compared to the non-plasma, Ta/TaN PVD circuit.

Figure 15:
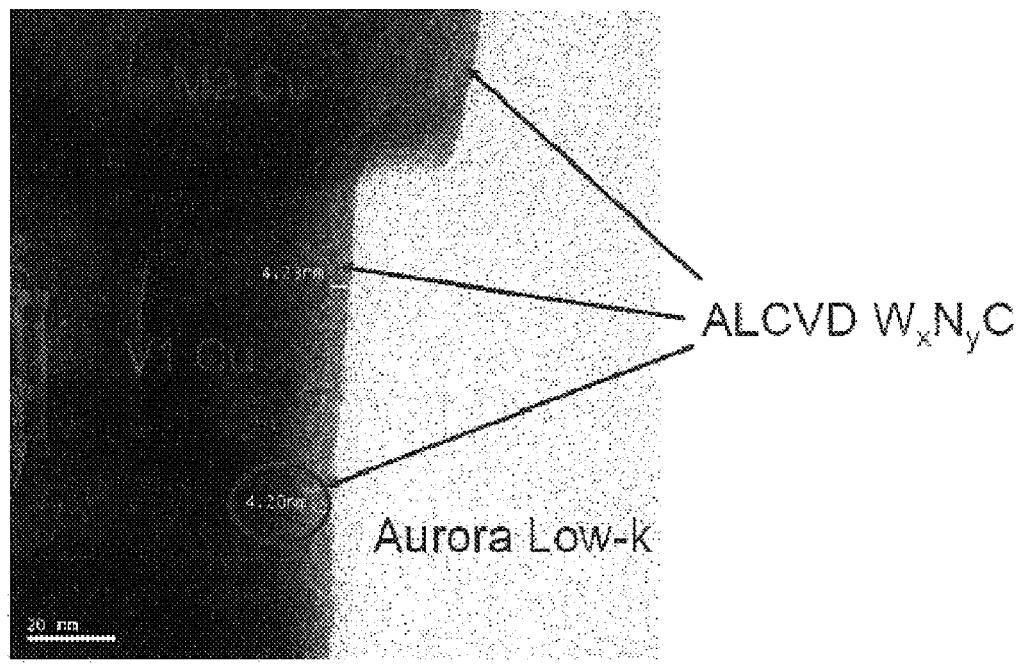
FIG. 15 is a TEM image of a $He/H_2$ plasma treated insulating surface and the resulting clean interface with the barrier layer.

Additionally, another barrier property that was improved was the "cleanness" of the barrier layer itself next to the insulating layer. This is primarily a description of the distinctness or precision of the interface between the barrier and the insulating material. An analysis of this characteristic can be achieved through a visual inspection of the interface, as shown in FIG. 15, which depicts the degree of precision for the interface of the $H_2$/He plasma treated insulating layer. In some embodiments, an improved barrier property will be as uniform or distinct as the one depicted in FIG. 15.

In one embodiment, the cleanness or precision can be measured by determining the volume or, alternatively, the thickness of the interface. The larger the volume (or thickness) of the interface, the less "clean" the interface is. Thus, the present $H_2$/He plasma treated interfaces will have relatively small volumes. In one embodiment, the volume is approximated by measuring the distance from one side of the interface to the other side. In another embodiment, the interface is measured through the consistency of the thickness of the barrier layer. Thus, barrier layers that are always the same thickness (e.g., 42 angstroms) wherever they are measured, demonstrate that the layer is very clean. In one embodiment, the measurements of the thickness of the barrier layer are taken randomly and averaged together and a standard deviation determined (the smaller the deviation, the cleaner the interface. In another embodiment, a set number of measurements at set locations are taken to obtain a standard deviation. Alternative methods of measurement will be known to one of skill in the art.

In the embodiment shown, a two point measurement depicts 4.23 and 4.20 nm of depth (or thickness) of the barrier layer, which yields a mean of 4.215, with a standard deviation of ±0.0212. The standard deviation can then be used to determine what percent of the mean value it is, with smaller percent representing cleaner interfaces. In this case, 0.0212*2 is the complete variation, demonstrating approximately a 1% variation in thickness. In one embodiment, the variation will be less than 10%, more preferably less than 5%, more preferably less than 1%, even more preferably less than 0.1%, and most preferably less than 0.001%. These points for measurement can be selected randomly, consistently, in a saturating manner, at maximal extremes (to provide the largest standard deviation between any two or more measurements) or minimal extremes.

Figure 16:
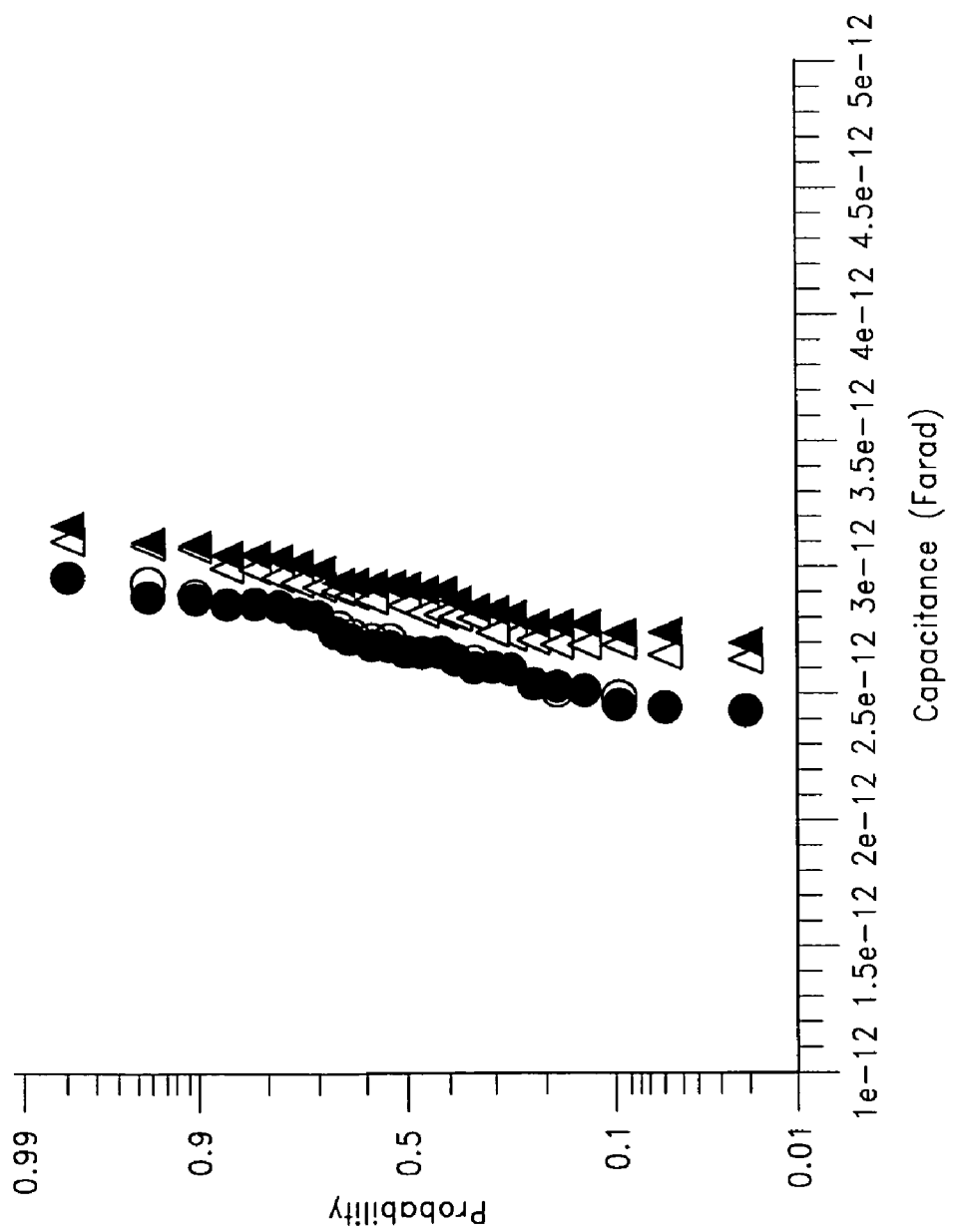
FIG. 16 is a graph comparing the capacitance characteristics of various circuits.

As will be appreciated by one of skill in the art, not every possible barrier property need be improved for the plasma treatment to be considered successful in resulting in an improved barrier layer. In some embodiments, only a single property is improved, in some embodiments most of the properties are improved. In a more preferred embodiment, the properties most important to a barrier layer are improved, even more preferably all of the properties except one are improved, even more preferably, all of those properties identified as improved in the above example, and most preferably all of the properties are improved. Thus, as can be seen in FIG. 16, while there is a small decrease in the capacitance of the He/$H_2$ plasma treated circuit, the plasma treatment and the barrier itself are still considered to enhance an improved barrier property.

As will be appreciated by one of skill in the art, the above methods and examples can be used to optimize variables, such as plasma conditions and the thickness of various materials, and select alternative materials from which the various layers, such as the barrier layer and the insulating layer can be made. Additionally, as noted above, plasma processing with an isotropic plasma process can also remove oxides from the bottom of the via, further improving the resulting circuit.

Methods of Forming Metal Seed Layers

After formation of the metal nitride barrier layer, a seed layer may be desirable, depending upon the method to be employed for filling the dual damascene structure and the conductivity of the deposited barrier layer. A copper filler is desirably electroplated over the illustrated metal nitride barriers. Accordingly, a highly conductive seed layer is preferably first formed over the barrier layer.

As is known in the art, the seed layer preferably comprises a metal layer, more preferably copper, and can be deposited by any of a number of processes. For example, it is preferably done by processing that employs PVD or sputtering to form a copper seed layer. In conjunction with high step coverage obtained in forming the prior metal nitride barrier layer by ALD; such methods may be adequate for many dual damascene schemes.

Alternatively, a CVD process is employed to deposit the seed layer with higher step coverage. Metal organic CVD (MOCVD) techniques are disclosed, for example, by Wolf et al., "Process and equipment simulation of copper chemical vapor deposition using Cu(HFAC)VTMS," Microelectronic Engineering, Vol. 45, No. 1, pp.15-27 (February 1999), the disclosure of which is incorporated herein by reference.

Alternatively, the seed layer is also formed by ALD. The volume saved by high step coverage formation of one or more of the adhesion, barrier and seed layers thus contributes to a higher-conductivity line due to a greater volume available for the more conductive filler metal and increased chance of completely filling the contact vias and trenches.

TABLE III

| Phase | Carrier Flow (slm) | Reactant | Reactant Flow (sccm) | Temperature (° C.) | Pressure (Torr) | Time (sec) |
|---|---|---|---|---|---|---|
| metal | 400 | CuCl | 4 | 350 | 10 | 0.2 |
| purge | 400 | — | — | 350 | 10 | 0.5 |
| reduce | 400 | TEB | 40 | 350 | 10 | 0.2 |
| purge | 400 | — | — | 350 | 10 | 0.5 |

Table III above illustrates an ALD pure metal process. In alternating phases, copper chloride is first adsorbed and then reduced by TEB. Advantageously, copper chloride is a smaller reactive species compared to organic copper species, facilitating rapid and more complete saturation of reactive sites on the workpiece.

The following section briefly provides an alternative description of the above steps and layers and how they interrelate with one another.

Resultant Integrated Circuits

Figure 17A:
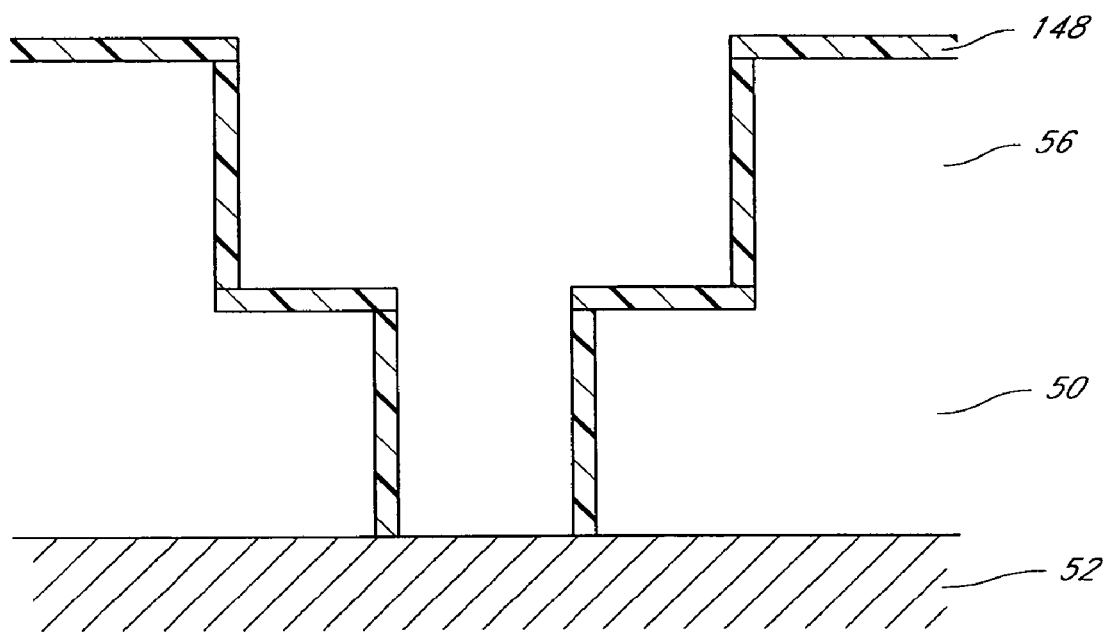

The dual damascene structure ofFFIG. 9a can serve as a starting point for describing a typical circuit. The surface is first adequately treated with a plasma (e.g., $H_2$/He, FIG. 17A) to result in a plasma treated layer 148 being formed from the outer surface of the insulating layer 56 and 50. The plasma treated layer 148 (the layer of the insulating material that has been altered by the plasma), reduces irregularities in the barrier layer deposited on top of the insulating layer. FIG. 17A does not depict the buried hard mask/etch stop layer 54 nor the CMP stop 58 shown in FIG. 9A. As noted previously, in some embodiments, the trenches and vias can be defined in a single insulating layer. For example, the trench and vias can be formed by a VFTL approach.

The liner (or at least one sub-layer therein) can be the result of a highly conformal ALD process by the layer's characteristic profile, and particularly by the uniformity of this profile. In a more preferred embodiment, the barrier layer 150 section of the liner layer comprises tungsten, nitrogen and carbon. This method produces a high conformality conductive layer of metal nitride carbide. The ALD lining layer can consist of a barrier layer alone.

Figure 17B:
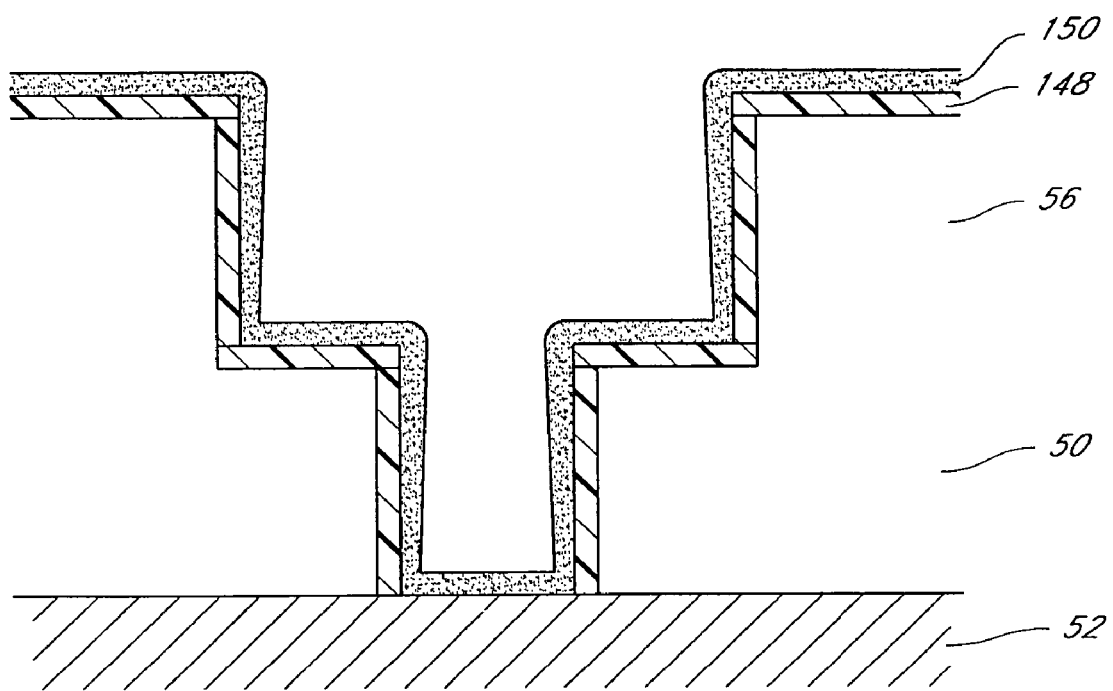

In accordance with the barrier needs of dual damascene processing, and particularly in conjunction with fast-diffusing copper metal filler, the barrier layer 150 of the lining layer is formed to about the minimal thickness necessary for adequate performance of its barrier function (FIG. 17B). Accordingly, the barrier layer 150 lining the deep trench and via structure preferably has a thickness of about 20 Å or more. At the same time, high step coverage provided by the methods disclosed herein enable formation of the desired thickness uniformly over all surfaces of the trench 60 and contact via 62, including insulating sidewalls and a conductive via floor. Accordingly, the barrier layer within the via 62 is preferably no more than about 200 Å at any point of the structure and at any point during the process. More preferably, the barrier of the preferred embodiments is deposited to a maximum thickness of between about 20 Å and 100 Å, even more preferably between about 30 Å and 60 Å, even more preferably between about 35 and 45 angstroms, and most preferably to a thickness of about 42 Å.

Under some conditions, material sufficient for a fraction of a monolayer is deposited per cycle, due to the physical size of the chemisorbed species preventing occupation of all available sites, particularly if the adsorbed species include organic ligands. In a preferred embodiment, about 20 cycles or more are used, more preferably between about 30 and 90, even more preferably between about 30 and 60 cycles, and most preferably about 60 cycles.

As noted, the methods described herein can enable extremely high step coverage (defined as a thickness of the liner on the bottom of the via as a ratio of the thickness of the liner on sidewalls of the via), even of the high aspect ratio trench and via structures of the preferred embodiments. The lining layer, and particularly ALD-formed film(s) within the liner, preferably exhibit step coverage greater than about 90%, more preferably greater than about 93%, and most preferably greater than about 97%.

Figure 17C:
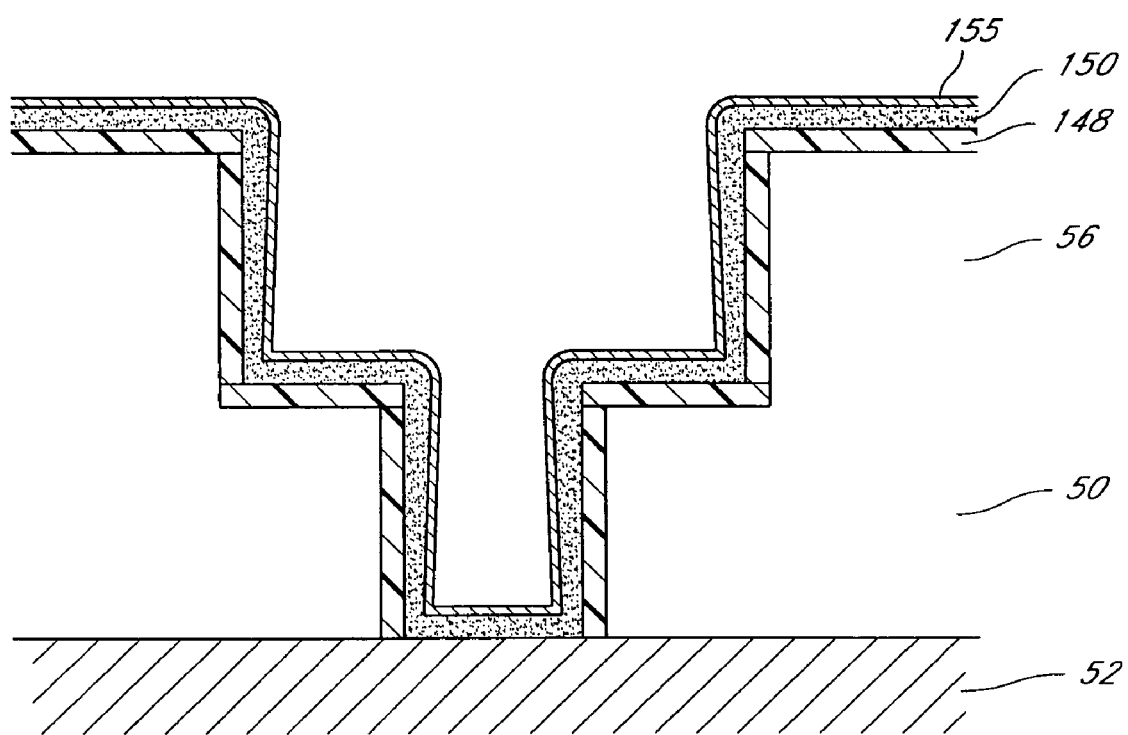

With reference now to FIG. 17C, a seed layer 155 is optionally formed over the barrier layer 150. As noted above, such a seed layer 155 is desirable where the filling metal is to be deposited by electroplating and where the barrier layer 150 demonstrates inadequate conductivity for effective electroplating. Under such conditions, the seed layer 155 can be added by ALD or CVD and most preferably by PVD. In the illustrated embodiment, a "pure" copper is employed for the seed layer. In a preferred embodiment, the copper seed layer is between 600 and 1000 angstroms, more preferably between 700 and 900 angstroms, and most preferably about 800 angstroms in thickness. In other arrangements, no seed layer is employed over the barrier layer 150, such as in process flows preceding a non-electroplating fill procedure or where the barrier layer is adequately conductive, and enables direct nucleation of electroplated copper.

Figure 17D:
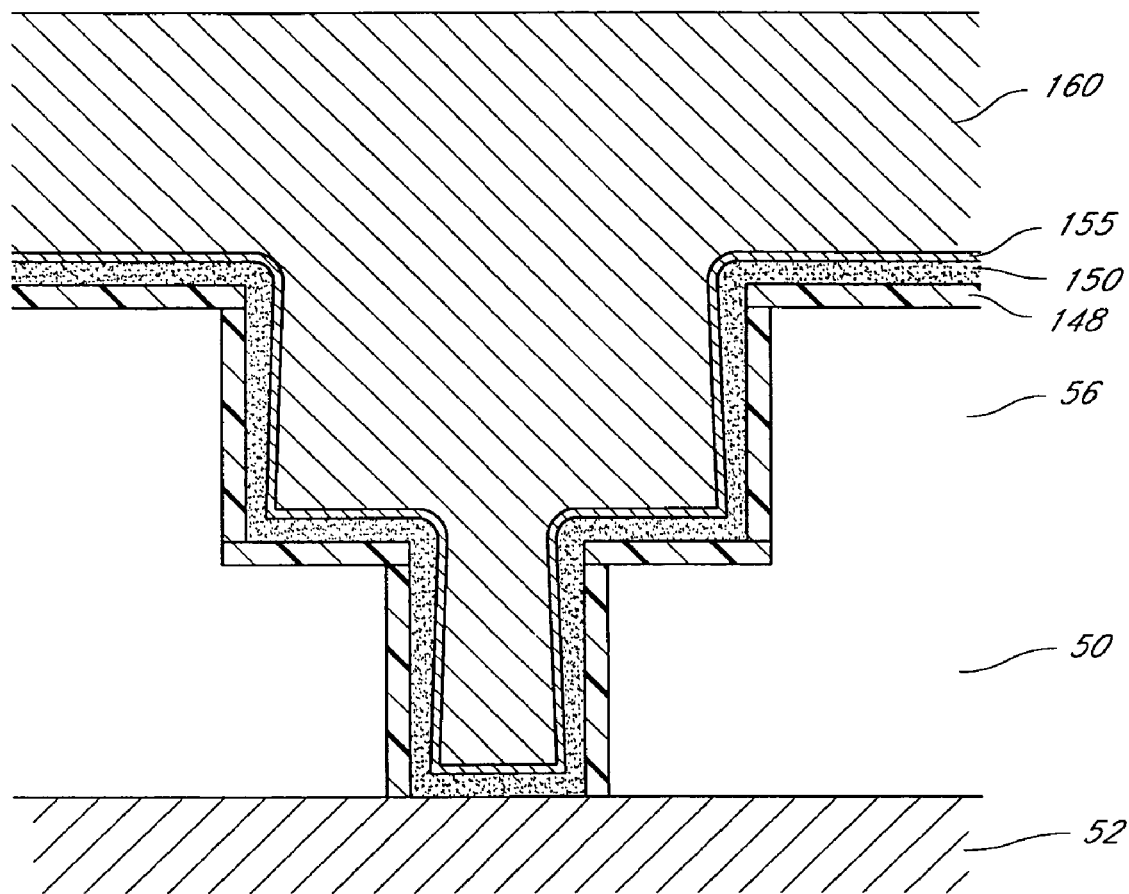

Referring now to FIG. 17D, the lined damascene structure is then filled with a highly conductive metal 160. In the illustrated embodiment, where a seeding film is formed over the barrier layer 150, the filler metal 160 preferably comprises electroplated copper. In other arrangements, metal such as aluminum can be deposited under high pressure and/or high temperatures to aid reflow into the deep trench and via structures, as will be appreciated by the skilled artisan. Effective barriers are also important in preventing spiking during the harsh conditions attending such deposition processes.

Figure 17E:
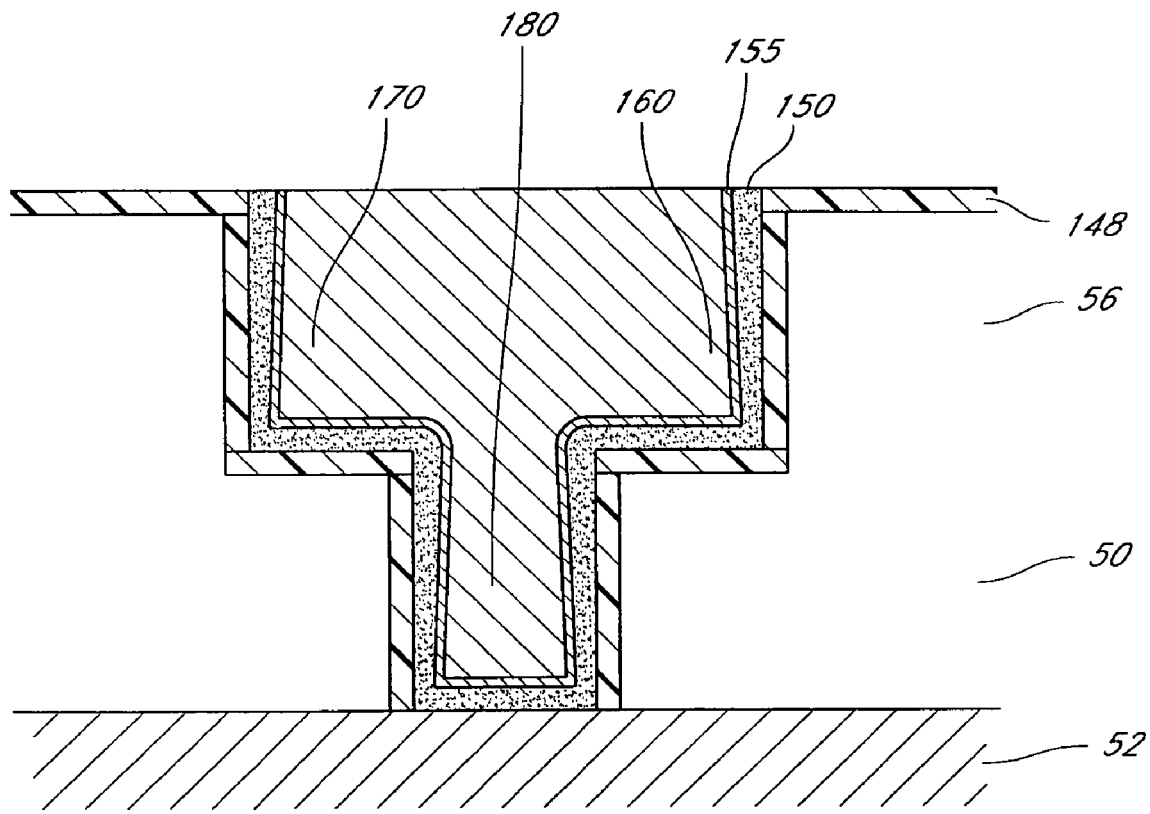

With reference now to FIG. 17E, the structures are then planarized by chemical mechanical planarization (CMP) or other etch back process to leave isolated lines 170 within the trenches 60, having integral contacts 180 extending downwardly therefrom. Diffusion of the filler metal 160 is prevented both during the fill process as well as during any high temperature processing that follows.

Advantageously, plasma energy can be readily directed to the entire surface, both the horizontal and vertical sections, of the insulating layer 50 and 56. As discussed in detail above, the surface of the plasma treated liner layer is altered by the plasma treatment, resulting in a plasma treated layer 148. Furthermore, such treatment can be performed even through intervening layers, such as etch stop or barrier layers, to minimize subsequent diffusion through open pore paths. In accordance with the disclosure hereinabove, however, such treatment by plasma preferably precedes the creation of the barrier layer or other layer. While it had previously been thought that pores on the side of the insulating material were not important in creating a stable and smooth interface, the current data reflects that plasma treatment of the sides of the insulating layer can result in superior layer interfaces (e.g., barrier layer/insulating layer) that are especially precise or uniform.

One advantage of the above-described sealing process is that it is very efficient and inexpensive relative to deposition techniques.

The above sealing or insulator manipulation processes are particularly useful to prevent filling openings by subsequent ALD processes, as discussed above. However, it will be appreciated that such sealing or insulator manipulation can also be useful to prevent subsequent diffusion from a variety of sources into the openings of a porous structure.

In FIGS. 17A-17E, no etch stop or CMP stop layers are employed. While the bottom section of the via is not denoted as a plasma treated layer, this section can also be exposed to the plasma; however, the benefits of plasma exposure to metal are different from the benefits of plasma exposure to the insulating material. As noted above, in some embodiments, the treatment of the bottom of the vias by an isotropic, reducing, plasma can also be beneficial to the device.

As will be appreciated by one of skill in the art, the teachings above can also be used in the creation of devices that are capable of carrying out the steps described above. Of particular interest are devices that can plasma process a surface in one chamber, transfer, under vacuum, the circuit to a second chamber where the barrier layer is deposited, transfer the circuit to a third chamber, under vacuum, where the copper can be added. Of course, variations are also contemplated, as long as the device assists in the plasma treatment in some manner.

Although the foregoing invention has been described in terms of certain preferred embodiments, other embodiments will be apparent to those of ordinary skill in the art. For example, while processes are specifically provided particular lining materials, the skilled artisan will readily appreciate that ALD methods can be applied to lining damascene structures with other materials. Moreover, although illustrated in connection with a particular process flow and structure for dual damascene metallization, the skilled artisan will appreciate variations of such schemes for which the methods disclosed herein will have utility. Additionally, other combinations, omissions, substitutions and modification will be apparent to the skilled artisan, in view of the disclosure herein. Accordingly, the present invention is not intended to be limited by the recitation of the preferred embodiments, but is instead to be defined by reference to the appended claims.

We claim:

1. A metallization process, comprising:
   forming trenches in a desired interconnect pattern in a low k insulating layer above a semiconductor substrate;
   treating an exposed surface of the trenches with a plasma process under conditions sufficient to improve a barrier property of a barrier layer compared to a barrier layer associated with a surface of trenches that have not undergone the plasma process, thereby forming a plasma processed surface, wherein the plasma process comprises a He/H$_2$ plasma process; and after treating an exposed surface of the trenches with the plasma process, lining the surfaces of the trenches with the barrier layer by an atomic layer deposition (ALD) process, wherein the ALD process is performed directly over the plasma processed surface.

2. The process of claim 1, further comprising depositing a copper seed layer over the barrier layer.

3. The process of claim 1, further comprising forming vias in the low k insulating layer in communication with the trenches.

4. The process of claim 1, wherein the plasma process consists of a He/H$_2$ plasma process.

5. The process of claim 4, wherein between the formation of the trenches and the plasma processing, the trenches are not subject to oxidation.

6. The process of claim 4, further comprising treating an exposed part of an underlying conductive element with an oxide removal process to reduce any oxidized metal, wherein said oxide removal process occurs before the He/H$_2$ plasma process.

7. The process of claim 1, wherein the He/H$_2$ plasma process reduces oxide from an underlying conductive element while treating trench sidewalls to improve the barrier property.

8. The process of claim 1, wherein the improved barrier property is an extended lifetime of more than 10 years of use with less than a 0.1 % cumulative failure risk for a circuit formed by the process.

9. The process of claim 8, wherein the extended lifetime is about 17 years.

10. The process of claim 1, wherein the He/H$_2$ plasma process comprises substrate treatment at 250-350° C.

11. The process of claim 1, wherein the interconnect pattern comprises vias exposing conductors at the bottom thereof and the improved barrier property is a lower via chain resistance than a via that has not had the plasma treatment.

12. The process of claim 11, wherein the lower via chain resistance is between about 1% and about 20% lower than a resistance in a via in a trench from a process that is identical except for the absence of the He/H$_2$ plasma process.

13. The process of claim 1, wherein the improved barrier property is a more uniform resistance of the barrier layer.

14. The process of claim 1, wherein the improved barrier property is an improved failure time in electro-migration.

15. The process of claim 1, wherein the conditions sufficient to improve the barrier property comprise an amount of time of exposure, wherein said exposed surface is treated for 5 to 20 seconds.

16. The process of claim 1, wherein the conditions sufficient to improve the barrier property comprise the plasma generated at 100-200 W at 13.5 MHz.

17. The process of claim 1, wherein the conditions sufficient to improve the barrier property comprise the plasma comprising 190 to 40 parts He to 10 to 160 parts H$_2$.

18. The process of claim 1, wherein the barrier layer comprises tungsten, nitrogen, and carbon.

19. The process of claim 18, wherein the barrier layer is deposited so that it is approximately 35 to 45 angstroms thick.

20. The process of claim 18, wherein the barrier layer consists essentially of tungsten, nitrogen, and carbon.

21. The process of claim 20, further comprising depositing a copper seed layer on the barrier layer by a physical vapor deposition (PVD) process.

22. The process of claim 1, wherein the insulating layer comprises a low-k siloxane polymer.

23. The process of claim 1, wherein the plasma process comprises supplying plasma products to the exposed surface of the trenches, wherein the plasma products are generated remotely.

24. The process of claim 1, wherein 30 to 60 ALD cycles are performed in establishing an effective barrier layer.

25. The process of claim 1, wherein the exposed surface of the trenches does not comprise an etch stop or CMP stop layer.

26. The process of claim 1, further comprising forming a via in the insulating layer, wherein said trenches and vias are formed by a via first, trench later (VFTL) process.

27. The process of claim 1, wherein said low k insulating layer comprises a buried etch stop layer.

28. A method of making an integrated circuit comprising:
plasma processing a surface of a low k insulating layer, wherein said plasma processing comprises the use of a hydrogen plasma that includes helium to process the surface, thereby producing a plasma processed surface; and after plasma processing the surface of the layer, lining said surface with a barrier layer deposited via atomic layer deposition (ALD), wherein the barrier layer comprises metal, carbon, and nitrogen, and wherein an interface between the surface and the barrier layer is relatively uniform in that the standard deviation of thickness of the barrier layer is less than about 5% of the mean of the thickness of the barrier, and wherein the ALD process is performed directly over the plasma processed surface.

29. The method of claim 28, further comprising forming an electrochemical deposition seed layer over the barrier layer.

30. The method of claim 28, wherein said metal is tungsten.

31. The method of claim 28, wherein said reducing plasma consists of a plasma formed from H$_2$ and He.

32. The method of claim 31, wherein the plasma comprises 190 to 40 parts He to 10 to 160 parts H$_2$.

33. The method of claim 28, wherein the layer that comprises the surface that is to be processed by the plasma comprises a low k insulating material that has a dielectric of less than 3.3.

34. The method of claim 28, wherein said insulating material is selected from the group consisting of at least one of: fluorinated silicate glass, tetraethylorthosilicate, and a porous insulating material.

35. The method of claim 28, wherein the standard deviation of thickness of the barrier layer is less than about 1% of the mean of the thickness of the barrier.

36. The method of claim 29, wherein the surface that is plasma processed is a surface of a via and a surface of a trench.

37. The method of claim 30, wherein the surface that is plasma processed is a surface of a damascene trench.

38. The method of claim 37, wherein the circuit has an extended lifetime of more than 10 years of use with less than 0.1 % cumulative failure risk.

39. The method of claim 28, wherein said plasma processing is performed sufficiently so that a circuit that is made with the plasma processing has a superior barrier property than a circuit that is made without the plasma processing, wherein the circuits are otherwise made by a same process.

40. The method of claim 28, wherein said plasma processing is performed sufficiently so that a circuit that is made with the plasma processing has a lower resistance than a circuit that is made without the plasma processing, wherein the circuits are otherwise made by a same process.

41. A metallization process, comprising:
  forming trenches and vias in a desired interconnect pattern in a low k insulating layer above a semiconductor substrate;
  treating an exposed surface of the trench with a plasma process, thereby forming a plasma processed surface, wherein said plasma process comprises a $H_2$/He plasma, and wherein said plasma process can treat substantially all of the exposed surfaces of the trenches; and
  after treating an exposed surface of the trench with the plasma process, lining the surfaces of the trench with the liner layer by an atomic layer deposition (ALD) process, wherein the ALD process is performed directly over the plasma processed surface.

42. The metallization process of claim 41, wherein the liner layer is a barrier layer.

43. The metallization process of claim 42, wherein the barrier layer comprises metal, carbon, and nitrogen.

44. The metallization process of claim 43, wherein the metal comprises tungsten.

45. The metallization process of claim 44, wherein the plasma process is generated remotely.

46. The metallization process of claim 45, wherein the plasma process is an unbiased plasma process.

* * * * *